US007483290B2

(12) United States Patent
Kikuchi et al.

(10) Patent No.: US 7,483,290 B2
(45) Date of Patent: Jan. 27, 2009

(54) NONVOLATILE MEMORY UTILIZING HOT-CARRIER EFFECT WITH DATA REVERSAL FUNCTION

(75) Inventors: Takashi Kikuchi, Fukuoka (JP); Kenji Noda, Fukuoka (JP)

(73) Assignee: NSCORE Inc., Fukuoka (JP)

( * ) Notice: Subject to any disclaimer, the term of this patent is extended or adjusted under 35 U.S.C. 154(b) by 70 days.

(21) Appl. No.: 11/701,958

(22) Filed: Feb. 2, 2007

(65) Prior Publication Data

US 2008/0186767 A1    Aug. 7, 2008

(51) Int. Cl.
*G11C 11/00*    (2006.01)
(52) U.S. Cl. .................. 365/154; 365/189.05; 365/200
(58) Field of Classification Search .................. 365/154, 365/185.08, 200, 189.05
See application file for complete search history.

(56) References Cited

U.S. PATENT DOCUMENTS

| 3,636,530 | A | 1/1972 | Mark et al. ................ 365/228 |
| 4,419,744 | A | 12/1983 | Rutter ........................ 365/154 |
| 5,956,269 | A | 9/1999 | Ouyang et al. ........ 365/185.08 |
| 6,038,168 | A | 3/2000 | Allen et al. ............ 365/185.07 |
| 6,064,590 | A | 5/2000 | Han et al. |
| 6,740,927 | B1 | 5/2004 | Jeng |
| 6,906,953 | B2 | 6/2005 | Forbes ................... 365/185.03 |
| 6,906,962 | B2 | 6/2005 | Layman et al. ........ 365/189.01 |
| 6,909,635 | B2 | 6/2005 | Forbes et al. ................. 365/174 |
| 7,227,234 | B2 | 6/2007 | Roizin et al. |
| 7,321,505 | B2 * | 1/2008 | Noda .......................... 365/154 |
| 2004/0232477 | A1 | 11/2004 | Iwata et al. |
| 2004/0252554 | A1 | 12/2004 | Fournel et al. |

FOREIGN PATENT DOCUMENTS

| JP | 06-076582 | 3/1994 |
| JP | 06-231587 | 8/1994 |
| JP | 2001-156188 | 6/2001 |
| JP | 2002-237540 A | 8/2002 |
| WO | 2004/057621 A1 | 7/2004 |
| WO | 2006/093629 A1 | 9/2006 |

* cited by examiner

*Primary Examiner*—Huan Hoang
(74) *Attorney, Agent, or Firm*—Ladas & Parry, LLP

(57) ABSTRACT

A nonvolatile semiconductor memory device includes a control circuit, an inverting circuit, and memory units, each of the memory units including a latch having a first node and a second node, a plate line, a first MIS transistor having one of source/drain nodes coupled to the first node of the latch, another one of the source/drain nodes coupled to the plate line, and a gate node coupled to a word line, and a second MIS transistor having one of source/drain nodes coupled to the second node of the latch, another one of the source/drain nodes coupled to the plate line, and a gate node coupled to the word line, wherein the control circuit is configured to invert the data latched in the latch by reading the data from the latch, causing the inverting circuit to invert the read data, and writing the inverted data to the latch.

9 Claims, 21 Drawing Sheets

FIG.5A
FIG.5B
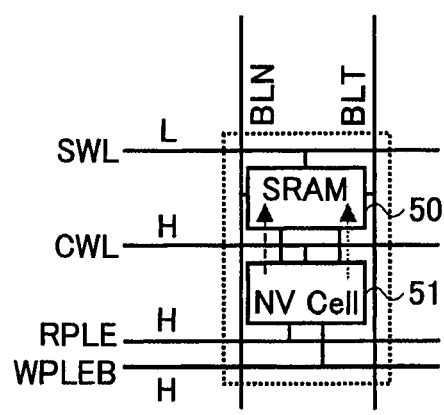
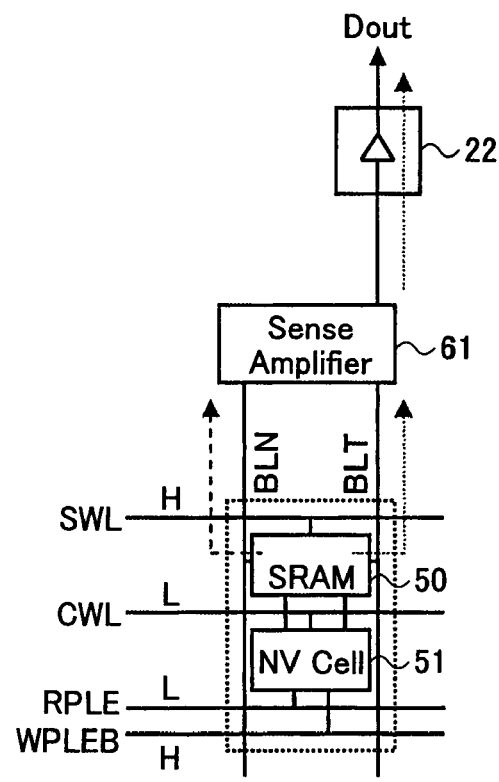

NONVOLATILE MEMORY UTILIZING HOT-CARRIER EFFECT WITH DATA REVERSAL FUNCTION

BACKGROUND OF THE INVENTION

1. Field of the Invention

The present invention generally relates to a memory circuit, and particularly relates to a nonvolatile memory circuit which is capable of retaining stored data in the absence of a power supply voltage.

2. Description of the Related Art

Nonvolatile semiconductor memory devices, which can retain stored data even when power is turned off, include flash EEPROMs employing a floating gate structure, FeRAMs employing a ferroelectric film, MRAMs employing a ferromagnetic film, etc.

In the case of EEPROMs, there is a need to manufacture a transistor having a special structure comprised of a floating gate. In the case of FeRAMs and MRAMs, which achieve nonvolatile storage by use of a ferroelectric material and a ferromagnetic material, respectively, there is a need to form and process a film made of these respective materials. The need for such transistor having a special structure and the need for such film made of a special material are one of the factors that result in an increase in the manufacturing costs.

PCT/JP2003/016143, which was filed on Dec. 17, 2003, the entire contents of which are hereby incorporated by reference, discloses a nonvolatile memory cell (i.e., a basic unit of data storage) comprised of a pair of MIS (metal-insulating film-semiconductor) transistors that have the same structure as ordinary MIS transistors used for conventional transistor functions (e.g., switching function). Namely, these memory cell transistors use neither a special structure such as a floating gate nor a special material such as a ferroelectric material or a ferromagnetic material. These MIS transistors are configured to experience an irreversible hot-carrier effect on purpose for storage of one-bit data. A difference in the transistor characteristics caused by the hot-carrier effect represents one-bit data "0" or "1".

Specifically, when one of the two transistors is subjected to a hot-carrier effect, a difference in the ON current develops between the two transistors. The difference in the ON current may be detected by a one-bit static memory circuit (latch) coupled to the transistor pair.

A hot-carrier effect is asymmetric with respect to the source and drain relation of a transistor. When the source node and drain node used to apply a bias for generating a hot-carrier effect are used as a source node and a drain node, respectively, at the time of detecting a drain current, the detected drain current exhibits a relatively small drop caused by the hot-carrier effect. When the source node and drain node used to apply a bias for generating a hot-carrier effect are swapped and used as a drain node and a source node, respectively, at the time of detecting a drain current, the detected drain current exhibits a significant drop caused by the hot-carrier effect. The difference in the detected drain current between these two scenarios is approximately a factor of 10.

Such asymmetric characteristic of a hot-carrier effect, when properly used, may serve to enhance the data write speed of the nonvolatile semiconductor memory device utilizing a hot-carrier effect. Certain considerations, however, must be made when utilizing such asymmetric characteristics. Since the source node and drain node are swapped between the data-write operation and the data-read operation, data read from the nonvolatile memory cell appears as being reversed from the data that was originally written to the nonvolatile memory cell.

SUMMARY OF THE INVENTION

It is a general object of the present invention to provide a nonvolatile semiconductor memory device that substantially obviates one or more problems caused by the limitations and disadvantages of the related art.

It is another and more specific object of the present invention to provide a hot-carrier-effect-based nonvolatile semiconductor memory device that utilizes the asymmetric characteristic of a hot-carrier effect for the purpose of enhancing data-write speed, and that can read correct data despite the reversal (inversion) of data upon the swapping of a source node and a drain node.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

To achieve these and other advantages in accordance with the purpose of the invention, the invention provides a nonvolatile semiconductor memory device, which includes a control circuit, an inverting circuit, and a plurality of memory units arranged in a matrix, each of the memory units including a latch having a first node and a second node configured to be set to potentials responsive to latched data and inverse to each other, a plate line configured to be settable to a selected one of a first potential and a second potential, a first MIS transistor having one of source/drain nodes thereof coupled to the first node of the latch, another one of the source/drain nodes thereof coupled to the plate line, and a gate node thereof coupled to a word line, and a second MIS transistor having one of source/drain nodes thereof coupled to the second node of the latch, another one of the source/drain nodes thereof coupled to the plate line, and a gate node thereof coupled to the word line, wherein the control circuit is configured to perform an inverting operation that inverts the data latched in the latch by reading the data from the latch, causing the inverting circuit to invert the read data, and writing the inverted data to the latch.

According to at least one embodiment of the present invention, a hot-carrier-effect-based nonvolatile semiconductor memory device is provided that utilizes the asymmetric characteristic of a hot-carrier effect for the purpose of enhancing data-write speed, and that can read correct data despite the inversion of data upon the swapping of a source node and a drain node.

BRIEF DESCRIPTION OF THE DRAWINGS

Other objects and further features of the present invention will be apparent from the following detailed description when read in conjunction with the accompanying drawings, in which:

FIGS. 5A and 5B are illustrative drawings for explaining a first embodiment the recall and read operations of the memory cell shown in FIG. 3;

DESCRIPTION OF THE PREFERRED EMBODIMENTS

In the following, embodiments of the present invention will be described with reference to the accompanying drawings.

In the present invention, a memory cell includes a pair of MIS (metal-insulating film-semiconductor) transistors that have the same structure as ordinary MIS transistors used for conventional transistor functions (e.g., switching function). Namely, these memory cell transistors use neither a special structure such as a floating gate nor a special material such as a ferroelectric material or a ferromagnetic material. These MIS transistors are configured to experience a hot-carrier effect on purpose for storage of one-bit data.

The hot-carrier effect leaves an irreversible lingering change in the transistor characteristics. Changes in the characteristics of the MIS transistors caused by the hot-carrier effect achieve a nonvolatile data retention. Which one of the MIS transistors has a strong lingering change determines whether the stored data is "0" or "1".

In the present invention, a drain node and a source node used to apply a bias for generating the hot-carrier effect are swapped and used as a source node and a drain node, respectively, at the time of reading the data. With the swapping of the source and drain nodes at the time of data read operation relative to the time of data write operation, a change in the transistor characteristics caused by the hot-carrier effect is efficiently used as a means to store data.

Further, the present invention utilizes a latch (flip-flop) circuit to determine data to be stored in the memory-cell MIS transistors. The latch circuit is also used to read (sense) the data stored in the memory-cell MIS transistors. The latch circuit and the memory-cell MIS transistors together constitute a memory cell (memory circuit) according to the invention.

A circuit provided to control the memory cell is configured such that a high potential is not applied to the latch circuit when this high potential is applied to the memory-cell MIS transistors to cause a hot-carrier effect. With this arrangement, the present invention avoids causing a hot-carrier effect to the transistors used in the latch circuit, and, thus, these transistors do not have to be designed to have a thicker gate oxide film that ensures hot-carrier-effect-free transistor operations even at high potentials. All the MIS transistors used in the memory cell (i.e., the MIS transistors serving as memory cell transistors and the MIS transistors constituting the latch circuit) may thus be properly designed to have the same structure with the same thickness of the gate oxide film. The present invention, however, is not limited to such identical thickness configuration, and each transistor may be designed to have its own thickness according to design requirements.

Figure 1:
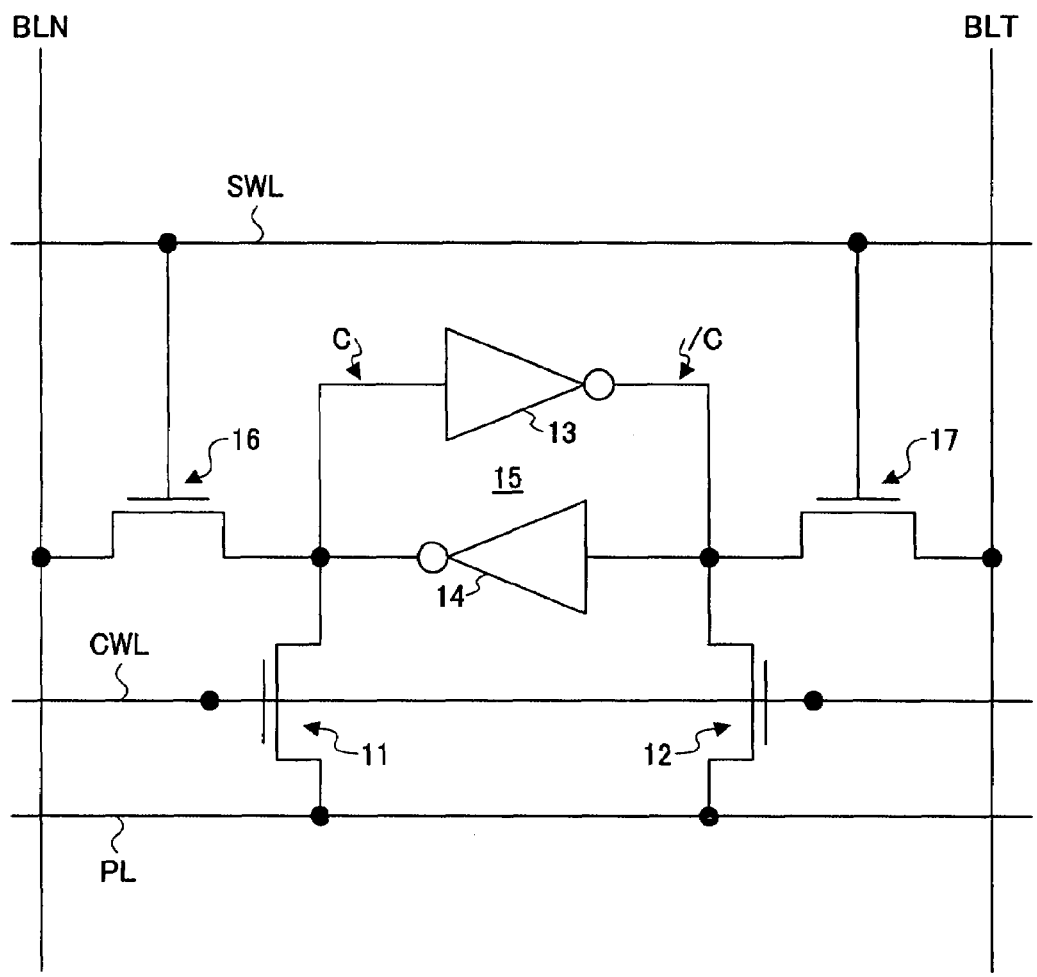
FIG. 1 is a circuit diagram showing an example of the configuration of a nonvolatile semiconductor memory circuit according to the present invention.

FIG. 1 is a circuit diagram showing an example of the configuration of a nonvolatile semiconductor memory circuit according to the present invention. In FIG. 1, the nonvolatile memory cell according to the present invention is comprised of n-channel silicon MOS transistors as a non-limiting example. Other transistors such as p-channel silicon MOS transistors may as well be used to form the nonvolatile memory cell according to the present invention.

A memory cell (i.e., a basic unit of data storage) shown in FIG. 1 includes an NMOS transistor 11, an NMOS transistor 12, and inverters 13 and 14. The NMOS transistors 11 and 12 together serve as a nonvolatile cell (hereinafter referred to as an NV cell), and the inverters 13 and 14 together serve as a latch circuit (hereinafter referred to as an SRAM cell). The NV cell and the SRAM cell together constitute a memory cell of the present invention.

The gate node of the NMOS transistor 11 and the gate node of the NMOS transistor 12 are coupled to an NV word line CWL. One of the source/drain nodes of the NMOS transistor 11 is coupled to a plate line (controlled-power line) PL, and the other is coupled to an electrical node C. One of the source/drain nodes of the NMOS transistor 12 is coupled to the plate line PL, and the other is coupled to an electrical node /C (the symbol "/" preceding another symbol indicates an inverse of the latter symbol).

Each of the inverters 13 and 14 has the output thereof coupled to the input of one another, thereby forming an SRAM cell 15. The electrical node C and electrical node /C of the SRAM cell 15 have respective bi-stable potentials that are inverse to each other.

An NMOS transistor 16 provides a coupling between the electrical node C and a bit line BLN. The NMOS transistor 17 provides a coupling between the electrical node /C and the bit line BLT. With this provision, it is possible to control the inputting/outputting of data into/from the SRAM cell 15 through the NMOS transistors 16 and 17.

When an SRAM word line SWL is activated to HIGH, the NMOS transistors 16 and 17 become conductive. The data stored in the SRAM cell 15 is thus read to the bit lines BL and /BL. If the bit lines BL and /BL are externally forced to respective potentials, on the other hand, the data represented by the bit line potentials is stored in the SRAM cell 15 through the NMOS transistors 16 and 17.

The NMOS transistor 11 and NMOS transistor 12 are conventional MIS (metal-insulating film-semiconductor) transistors, which are substantially the same as the MIS transistors used in the inverters 13 and 14. The NMOS transistor 11 and NMOS transistor 12 are designed such as to operate with a power supply voltage of 1.8 V, for example. Namely, when these transistors are driven with a voltage no greater than 1.8 V, a change in the characteristics due to a hot-carrier effect does not occur from a practical point of view.

The electrical nodes C and /C of the SRAM cell 15 are set to respective potentials that are inverse to each other. For example, the electrical node C may be set to 0 V, and the electrical node /C may be set to 1.8 V.

After the electrical nodes C and /C are set to the respective potentials as described above, the potential of the plate line PL is set to 3.3 V, for example. Further, the potential of the NV word line CWL is set to 1.65 V, for example. The potential of the NV word line CWL is determined such as to maximize the effect of a hot-carrier phenomenon. Generally, such potential is selected to be half the voltage between the source node and drain node of the transistor that is subjected to a hot-carrier effect.

When the potentials are set as described above, a voltage of 3.3 V between the plate line PL and the electrical node C is applied between the drain node and source node of the NMOS transistor 11. Further, a voltage of 1.65 V between the NV word line CWL and the electrical node C is applied between the gate node and source node of the NMOS transistor 11.

Since these bias voltages are larger than the voltages used in routine operations, the NMOS transistor 11 experiences a strong hot-carrier effect. Specifically, the application of the bias voltages for duration of 0.1 second to 1 second serves to generate a change in the characteristics that is substantially larger than the normal variation of the transistor characteristics. For example, the threshold voltage of the NMOS transistor 11 rises a few tens of millivolts. In other words, the channel resistance decreases approximately by 10%.

It should be noted that such a change in the transistor characteristics caused by a hot-carrier effect is localized around the drain node of the NMOS transistor 11, i.e., around the node of the NMOS transistor 11 that is coupled to the electrical node C.

In the example described above, only the NMOS transistor 11 experiences a hot-carrier effect. The NMOS transistor 12 does not experience a hot-carrier effect because a voltage across its drain node and source node is only 1.5 V, which is within the range of voltages used in routine operations.

If the potentials of the electrical nodes C and /C are reversed, with C being set to 1.8 V and /C being set to 0 V, the NMOS transistor 11 having 1.5 V applied between the drain node and source node thereof does not experience a hot-carrier effect. There is thus no lingering change in the transistor characteristics of the NMOS transistor 11. On the other hand, the NMOS transistor 12 experiences a hot-carrier effect.

The hot-carrier effect as described above leaves an irreversible lingering change in the transistor characteristics. Changes in the characteristics of the NMOS transistor 11 and NMOS transistor 12 caused by the hot-carrier effect thus achieve a nonvolatile data retention that reflects the initial potential settings of the electrical nodes C and /C.

During the operation to store (write) nonvolatile data as described above, the high potential (3.3 V) is never applied to the inverters 13 and 15. This is because the NMOS transistors 11 and 12 serve as intervening circuit elements between the plate line PL (3.3 V) and the nodes C and /C. Since the NV word line CWL is set to 1.65 V, and the nodes C and /C are serving as source nodes, the potentials at the nodes C and /C cannot exceed 1.65 V minus the threshold voltage.

In this configuration, therefore, a hot-carrier effect does not happen in the transistors used in the latch circuit. All the MIS transistors used in the memory cell (i.e., the MIS transistors 11 and 12 serving as memory cell transistors and the MIS transistors constituting the latch circuit) can thus be properly designed to have the same structure with the same thickness of the gate oxide film.

In order to recall (read) the data from the NMOS transistor 11 and the NMOS transistor 12, the SRAM cell 15 comprised of the inverters 13 and 14 is initially placed in an electrically inactive state, and is then shifted to an electrically active state. This may be achieved by shifting the power supply voltage VDD applied to the inverters 13 and 14 from 0 V to 1.8 V. The potentials of the NV word line CWL and the plate line PL are set to 1.8 V and 0 V, respectively, before the SRAM cell 15 is activated.

In a first case, the NMOS transistor 11 has a lingering change in the characteristics due to a hot-carrier effect (such as an increase in the threshold voltage or a decrease in the ON current), whereas the NMOS transistor 12 does not have such a lingering change in the characteristics. In this case, the force that pulls down the electrical node C is weaker than the force that pulls down the electrical node /C. After the activation of the SRAM cell 15, therefore, the electrical node C is set to the HIGH level, and the electrical node /C is set to the LOW level.

In a second case, the NMOS transistor 12 has a lingering change in the characteristics due to a hot-carrier effect (such as an increase in the threshold voltage or a decrease in the ON current), whereas the NMOS transistor 11 does not have such a lingering change in the characteristics. In this case, the force that pulls down the electrical node C is stronger than the force that pulls down the electrical node /C. After the activation of the SRAM cell 15, therefore, the electrical node C is set to the HIGH level, and the electrical node /C is set to the LOW level.

In this manner, the configuration shown in FIG. 1 can detect and sense the data stored through a hot-carrier effect. It should be noted, however, that the HIGH/LOW levels of the electrical nodes C and /C are reversed between when the data is written and when the data is read. Because of this, there is a need to invert the data at the time of data writing or at the time of data reading.

In the present invention, a data reversal circuit (data inverting circuit) is provided to invert the data that is stored in the NV cell. Such data reversal circuit may invert data prior to the storing of the data in the NV cell, or may invert the data after the data is recalled from the NV cell. The detail of such data reversal circuit will later be described.

Figure 2:
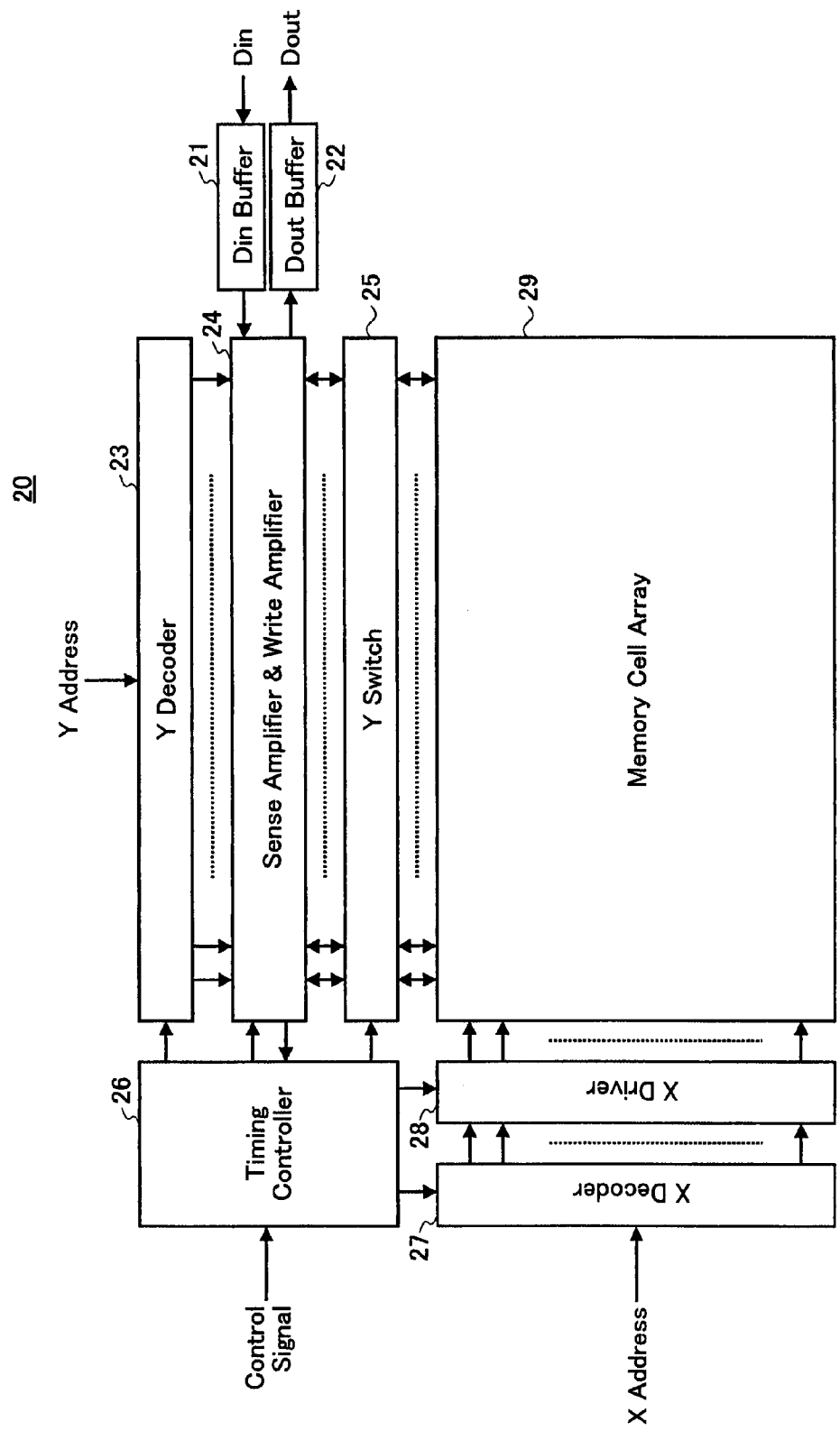
FIG. 2 is a block diagram showing the configuration of a first embodiment of a nonvolatile semiconductor memory device according to the present invention.

FIG. 2 is a block diagram showing the configuration of a first embodiment of a nonvolatile semiconductor memory device according to the present invention. A semiconductor memory device 20 shown in FIG. 2 includes a Din buffer 21, a Dout buffer 22, a Y decoder 23, a write-amplifier-&-sense-amplifier unit 24, a Y switch 25, a timing controller 26, an X decoder 27, an X driver 28, and a memory cell array 29.

The memory cell array 29 includes a plurality of memory cells arranged in a matrix form, with a plurality of word lines extending in a first direction, and a plurality of bit lines extending in a second direction perpendicular to the first direction. Each memory cell has a circuit configuration as will later be described. The memory cells arranged in the same column (same Y address) are connected to the same bit lines, and the memory cells arranged in the same row (same X address) are connected to the same word line.

The timing controller 26 receives control signals from an exterior of the device, and decodes the control signal to determine an operation mode (e.g., a write operation mode or a read operation mode). Timing control signals responsive to the determined operation mode are supplied from the timing controller 26 to the Y decoder 23, the write-amplifier-&-sense-amplifier unit 24, the Y switch 25, the X decoder 27, the X driver 28, etc., for control of the individual parts of the semiconductor memory device 20.

The Y decoder 23 receives a Y address input from the exterior of the device, and decodes the Y address input to determine a selected column. The decode signals indicative of the selected column are supplied to the write-amplifier-&-sense-amplifier unit 24.

The X decoder 27 receives an X address input from the exterior of the device, and decodes the X address input to determine a selected row. The decode signals indicative of the selected row are supplied to the X driver 28.

In response to the timing control signals from the timing controller 26 and the decode signals from the X decoder 27, the X driver 28 activates a selected SRAM word line among the SRAM word lines extending from the X driver 28. As a result of the activation of the selected SRAM word line, a volatile memory unit (such as the SRAM cell 15 of FIG. 1) is coupled to a corresponding bit line pair among a plurality of bit line pairs. Through this coupling, the writing/reading of data to/from the volatile memory portion is performed.

In response to the timing control signals from the timing controller 26 and the decode signals from the Y decoder 23, the Y switch 25 couples bit lines corresponding to the selected column to the write-amplifier-&-sense-amplifier unit 24. Through this coupling, data is transferred between the memory cell array 29 and the write-amplifier-&-sense-amplifier unit 24. Sense amplifiers of the write-amplifier-&-sense-amplifier unit 24 amplify the data read from the memory cell array 49 for provision to the Dout buffer 22. The data is output from the Dout buffer 22 to the exterior of the device as output data. Input data supplied to the Din buffer 21 is provided to the write-amplifier-&-sense-amplifier unit 24. Write amplifiers of the write-amplifier-&-sense-amplifier unit 24 amplify the input data to be written to the memory cell array 29.

Figure 3:
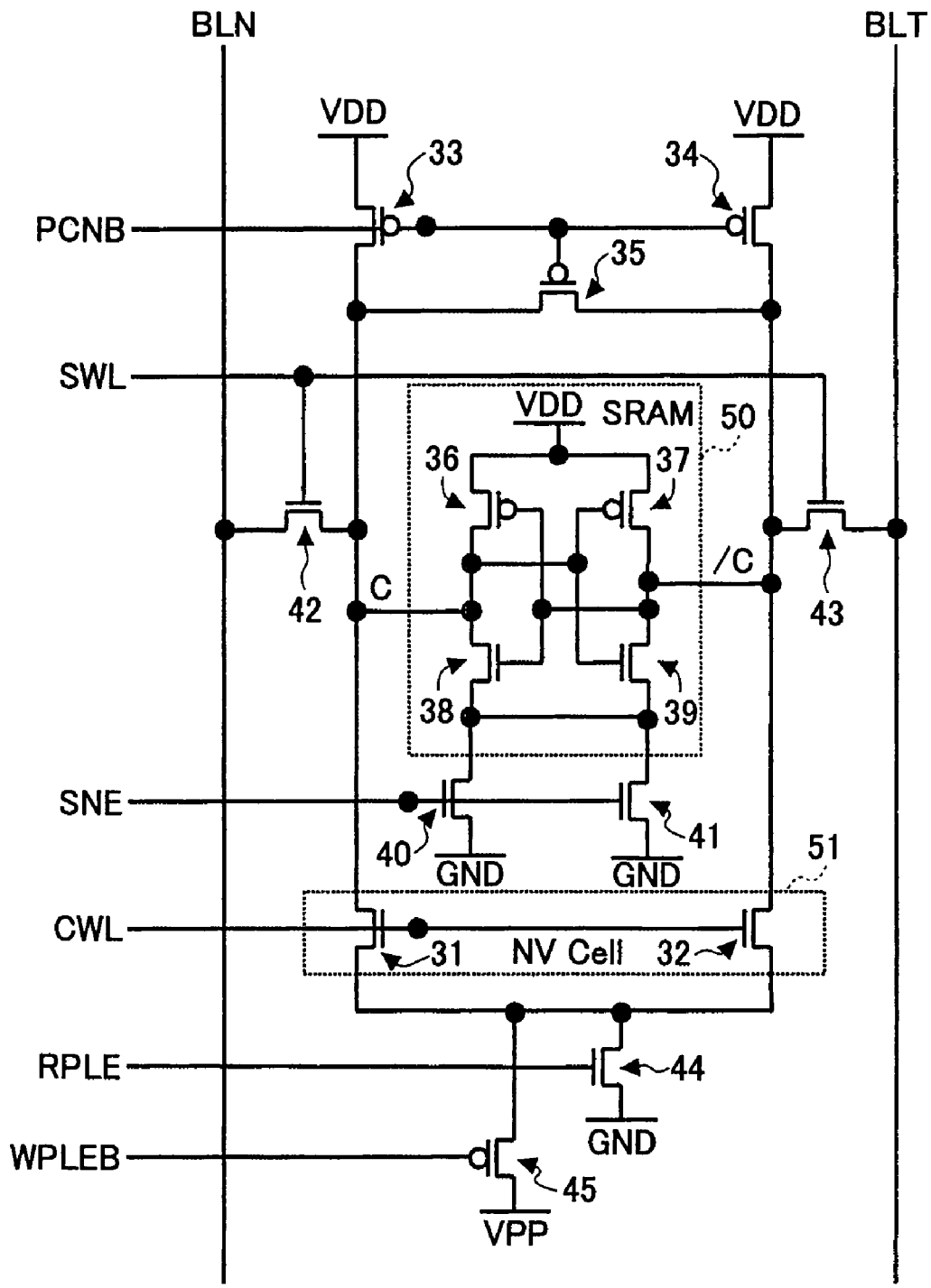
FIG. 3 is an illustrative drawing showing the configuration of a memory cell according to an embodiment of the nonvolatile memory device of the present invention.

FIG. 3 is an illustrative drawing showing the configuration of a memory cell according to an embodiment of the nonvolatile memory device of the present invention.

The memory cell includes NMOS transistors 31 and 32, PMOS transistors 33 through 37, NMOS transistors 38 through 44, a PMOS transistor 45. The NMOS transistors 38 and 39 and PMOS transistors 36 and 37 together constitute an SRAM cell 50, which corresponds to the SRAM cell 15 shown in FIG. 1. The NMOS transistors 31 and 32 correspond to the NMOS transistors 11 and 12 shown in FIG. 1, constituting an NV cell 51.

The NMOS transistors 11 and 12 serving as nonvolatile memory cell transistors have the same structure as the other NMOS transistors including the NMOS transistors 38 through 41 used in respect of the SRAM cell 50 and the NMOS transistors 42 and 43 used as a transfer gate between the memory cell and the bit lines. Further, it is preferable to manufacture all the MOS transistors of the memory cell with the same thickness of the gate oxide film. Namely, all the MOS transistors shown in FIG. 3 may be designed to operate with the same operating voltage (e.g., 1.8 V).

As shown in FIG. 3, bit lines BLN and BLT, which extend from the Y switch 25, are coupled to the SRAM cell 50 via the NMOS transistors 42 and 43 serving as a data transfer unit. A NV word line CWL, which extends from the X driver 28, is coupled to the gate nodes of the NMOS transistors 31 and 32 serving as the NV cell 51. An SRAM word line SWL, which extends from the X driver 28, is connected to the gates of the NMOS transistors 42 and 43.

Further, a cell precharge line PCNB, an SRAM disable line SNE, a recall plate voltage enable line RPLE, and a store plate voltage enable line WPLEB extend from the X driver 28, and are connected to the memory cell. Specifically, the cell precharge line PCNB is coupled to the gates of the PMOS transistors 33 through 35 for the purpose of precharging and equalizing the node C and /C. The SRAM disable line SNE is coupled to the gates of the NMOS transistors 40 and 41 so as to control the on/off state of the SRAM cell 50. The recall plate voltage enable line RPLE is coupled to the gate of the NMOS transistor 44. In response to the HIGH state of the recall plate voltage enable line RPLE, the data stored in the NV cell 51 is recalled, i.e., the data stored in the NV cell 51 is transferred to the SRAM cell 50. The store plate voltage enable line WPLEB is coupled to the gate of the PMOS transistor 45. In response to the LOW state of the store plate voltage enable line WPLEB, the data stored in the SRAM cell 50 is stored in the NV cell 51.

It should be noted that a signal line providing a coupling between the drain node of the PMOS transistor 45 and the drain node of the NMOS transistor 44 serves as the plate line that was described in connection with FIG. 1. Controlling the potential of this plate line through the controlling of the on/off state of the PMOS transistor 45 and the NMOS transistor 44 makes it possible to perform the store operation (write operation) and the recall operation (read operation) as described in connection with FIG. 1.

It should be noted that the configuration shown in FIG. 3 is identical with respect to each and every one of the memory cells provided in the memory cell array 29. Namely, multiple sets of the lines PCNB, SWL, SNE, CWL, RPLE, and WPLEB are provided in one-to-one correspondence to the rows of the memory cell array 29. Further, multiple sets of the bit lines BLN and BLT are provided in one-to-one correspondence to the columns of the memory cell array 29.

Figure 4C:
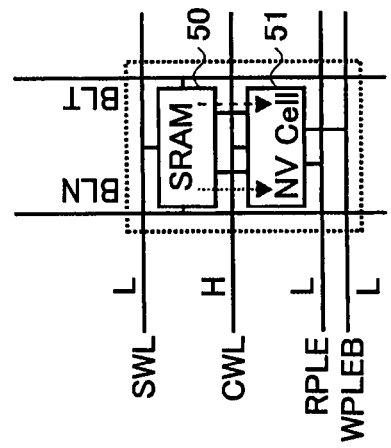
FIGS. 4A through 4C are illustrative drawings for explaining a first embodiment of the write and store operations of the memory cell shown in FIG. 3.
Figure 4B:
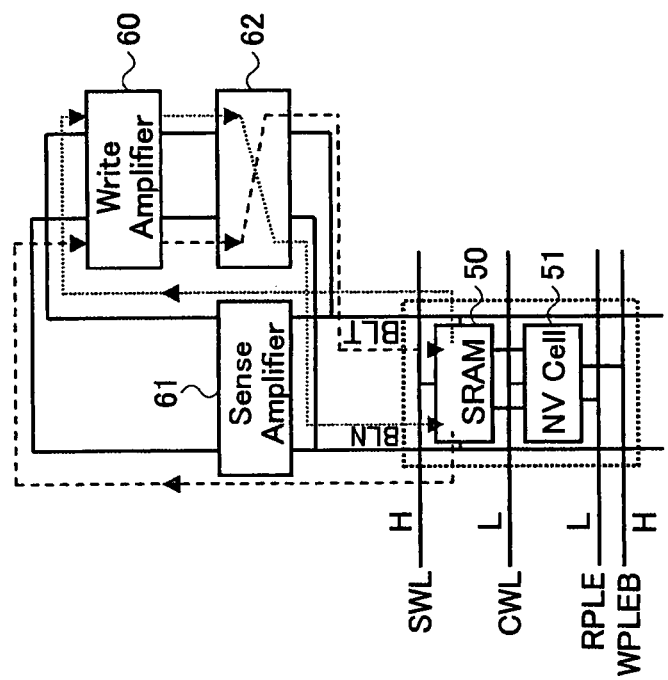
Figure 4A:
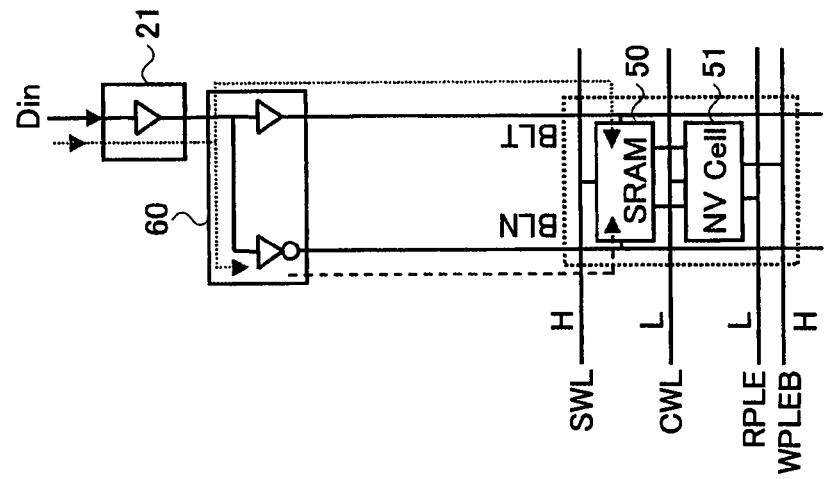

FIGS. 4A through 4C are illustrative drawings for explaining a first embodiment of the write and store operations of the memory cell shown in FIG. 3. In FIGS. 4A through 4C, the same elements as those of FIGS. 2 and 3 are referred to by the same numerals, and a description thereof will be omitted.

FIG. 4A shows a write operation by which data supplied from the exterior of the semiconductor memory device 20 is stored in the SRAM cell 50. As shown in FIG. 4A, the SRAM word line SWL is set to HIGH, and the NV word line CWL is set to LOW. Further, the recall plate voltage enable line RPLE is set to LOW, and the store plate voltage enable line WPLEB is set to HIGH.

With these settings of the signal lines, data is supplied from the exterior to a write buffer 60 via the Din buffer 21. The write buffer 60 is a portion of the write-amplifier-&-sense-amplifier unit 24 shown in FIG. 2, and serves to amplify the supplied data. The write buffer 60 also serves to generate complementary data, which is comprised of two binary values that are inverse to each other. The two binary values output from the write buffer 60 to the bit lines BLN and BLT are stored in the SRAM cell 50, with the SRAM word line SWL being in the HIGH state to couple the bit lines BLN and BLT to the SRAM cell 50. It should be noted that the transistors of the memory cell not included in the SRAM cell 50 and NV cell 51 are not shown in FIGS. 4A through 4C for the sake of convenience of illustration. In particular, the NMOS transistors 42 and 43 (see FIG. 3) connected to the SRAM word line SWL are not illustrated and treated as being included in the SRAM cell 50.

FIG. 4B shows an operation by which the data stored in the SRAM cell 50 is inverted as preparation for the storing of data in the NV cell 51. As shown in FIG. 4B, the SRAM word line SWL is set to HIGH, and the NV word line CWL is set to LOW. Further, the recall plate voltage enable line RPLE is set to LOW, and the store plate voltage enable line WPLEB is set to HIGH.

With these settings of the signal lines, the data stored in the SRAM cell 50 are read to the bit lines BLN and BLT, and are amplified by a sense amplifier 61. The sense amplifier 61 is a portion of the write-amplifier-&-sense-amplifier unit 24 shown in FIG. 2, and serves to amplify the data supplied from the SRAM cell 50. The data amplified by the sense amplifier 61 are supplied to the write buffer 60. The write buffer 60 amplifies the data supplied from the sense amplifier 61, and supplies the amplified data to an inverting circuit 62. The inverting circuit 62 may simply swap the two supplied bits with each other to output the swapped bits, or may simply invert each of the two supplied bits. The inverted data output from the inverting circuit 62 are supplied to the SRAM cell 50 for storage therein.

Since this operation described above reverses the data stored in the SRAM cell 50 based on the data stored in the SRAM cell 50, the data may keep being reversed again and again unless the loop that includes the sense amplifier 61, the write buffer 60, and inverting circuit 62 is cut at proper timing. This may be done by making the sense amplifier 61 insensitive to its inputs (i.e., the bit lines BLN and BLT) while maintaining the signal level of its output data, for example.

It should be noted that the inverting circuit 62 may be situated between the write buffer 60 and the bit lines BLN and BLT even when the write operation as shown in FIG. 4A is performed (although the inverting circuit 62 is not illustrated in FIG. 4A for the convenience of explanation). During the write operation, the inverting function of inverting circuit 62 may be disabled under the control of the timing controller 26. Further, the signal paths that connect between the sense amplifier 61 and the write buffer 60 to establish the above-described loop may include switching function, so that these paths are established only during the preparation operation as described above. During operations other than the preparation operation, these paths may be closed so that there is no returning of the data read from the SRAM cell 50 to the SRAM cell 50. These operations are implemented under the control of the timing controller 26.

FIG. 4C shows a store operation by which the data stored in the SRAM cell 50 is transferred to the NV cell 51. As shown in FIG. 4C, the SRAM word line SWL is set to LOW, and the NV word line CWL is set to HIGH (e.g., 3.3 V). Further, the recall plate voltage enable line RPLE is set to LOW, and the store plate voltage enable line WPLEB is set to LOW.

As the store plate voltage enable line WPLEB is set to LOW, the PMOS transistor 45 shown in FIG. 3 is turned on to set the plate line to a high potential VPP (e.g., 3.3 V). With the NV word line CWL being HIGH (e.g., 1.65 V), one of the NMOS transistors 31 and 32 of the NV cell 51 shown in FIG. 3 experiences a lingering change in its transistor characteristics in response to the data stored in the SRAM cell 50. The NV cell 51 thus stores the data of the SRAM cell 50 in a nonvolatile fashion.

FIGS. 5A and 5B are illustrative drawings for explaining a first embodiment the recall and read operations of the memory cell shown in FIG. 3. In FIGS. 5A and 5B, the same elements as those of FIGS. 2, 3 and 4A through 4C are referred to by the same numerals, and a description thereof will be omitted.

FIG. 5A shows a recall operation by which data stored in the NV cell 51 is transferred to the SRAM cell 50. As shown in FIG. 5A, the SRAM word line SWL is set to LOW, and the NV word line CWL is set to HIGH. Further, the recall plate voltage enable line RPLE is set to HIGH, and the store plate voltage enable line WPLEB is set to HIGH.

As the recall plate voltage enable line RPLE is set to HIGH, the NMOS transistor 44 shown in FIG. 3 is turned on to set the plate line to the ground potential. With the NV word line CWL being HIGH (e.g., 1.8 V), one of the NMOS transistors 31 and 32 of the NV cell 51 shown in FIG. 3 pulls down a corresponding one of the nodes C and /C stronger than the other transistor pulls down the other one of the nodes C and /C. As a result, the SRAM cell 50 latches that data that is stored in the NV cell 51. It should be noted that the recalled data have correct bit values since the original bit values inverted by the inverting circuit 62 prior to the store operation are inverted back to the original values by the recall operation.

FIG. 5B shows a read operation by which the data stored in the SRAM cell 50 is read out to the exterior of the semiconductor memory device 20. As shown in FIG. 5B, the SRAM word line SWL is set to HIGH, and the NV word line CWL is set to LOW. Further, the recall plate voltage enable line RPLE is set to LOW, and the store plate voltage enable line WPLEB is set to HIGH.

With the SRAM word line SWL being in the HIGH state to couple the bit lines BLN and BLT to the SRAM cell 50, data stored in the SRAM cell 50 are read to the bit lines BLN and BLT. The sense amplifier 61 amplifies the data supplied via the bit lines BLN and BLT. The data amplified by the sense amplifier 61 is then output to the exterior of the semiconductor memory device 20 via the Dout buffer 22.

Figure 6:
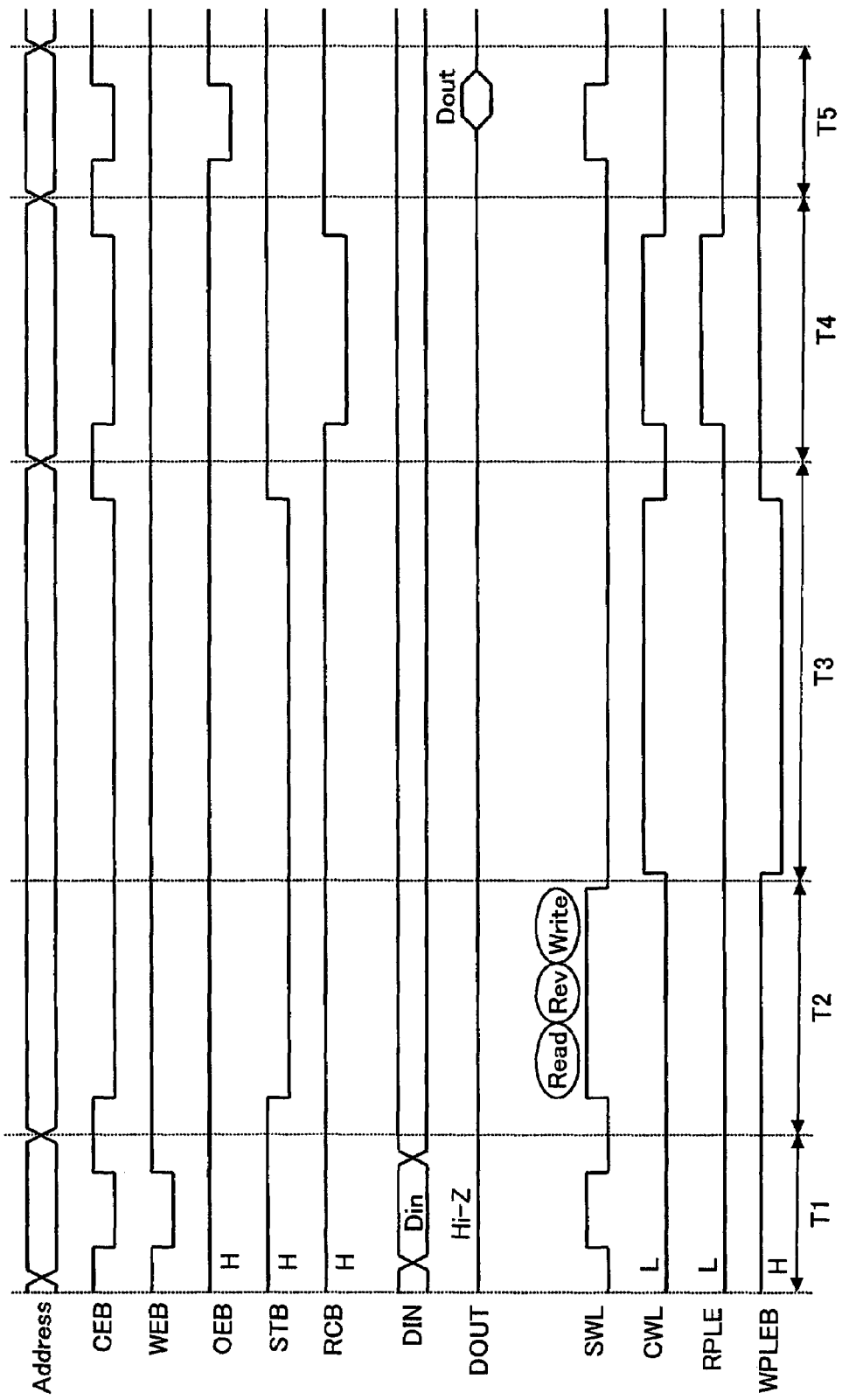
FIG. 6 is a drawing showing signal waveforms for explaining the first embodiment of the write, store, recall, and read operations of the memory cell shown in FIG. 3.

FIG. 6 is a drawing showing signal waveforms for explaining the first embodiment of the write, store, recall, and read operations of the memory cell shown in FIG. 3. In FIG. 6, CEB is a chip enable signal, WEB a write enable signal, OEB an output enable signal, STB a store enable signal, RCB a recall enable signal, DIN a data input, and DOUT a data output. SWL, CWL, RPLE, and WPLEB are already described. The chip enable signal CEB, the write enable signal WEB, the output enable signal OEB, the store enable signal SEB, and the recall enable signal REB are control signals that are input to the timing controller 26. Based on these control signals, the timing controller 26 generates various timing control signals that control the write, store, recall, and read operations.

T1 is a time period in which the write operation as shown in FIG. 4A is performed. During this period T1, the write enable signal WEB is asserted (set to LOW). In response, the SRAM word line SWL is set to HIGH to allow input data Din to be stored in the SRAM cell 50.

T2 is a time period in which the preparation for store operation (i.e., the inverting of the stored data) as shown in FIG. 4B is performed. At the beginning of this period T2, the store enable signal STB is asserted (set to LOW). In response, the timing controller 26 generates various timing control signals that control the X driver 28, the write-amplifier-&-sense-amplifier unit 24, and the Y switch 25 so as to cause the stored data to be read from the SRAM cell 50, inverted, and stored again in the SRAM cell 50.

T3 is a time period in which the store operation as shown in FIG. 4C is performed. Under the control of the timing controller 26 that has started the sequence of operations in response to the assertion of the store enable signal STB, the NV word line CWL is set to HIGH, and the store plate voltage enable line WPLEB is asserted (set to LOW). As a result, the data stored in the SRAM cell 50 is stored in the NV cell 51 in a nonvolatile manner.

T4 is a time period in which the recall operation as shown in FIG. 5A is performed. In response to the assertion (LOW state) of the recall enable signal RCB, the NV word line CWL is set to HIGH, and the recall plate voltage enable line RPLE is asserted (set to HIGH). This results in the data stored in the NV cell 51 being transferred to the SRAM cell 50.

T5 is a time period in which the read operation as shown in FIG. 5B is performed. In response to the assertion (LOW state) of the output enable signal OEB, the SRAM word line SWL is set to HIGH so as to electrically couple the SRAM cell 50 to the bit lines BLN and BLT. As a result, the data stored in the SRAM cell 50 is output to the exterior of the semiconductor memory device as output data Dout.

Figure 7A:
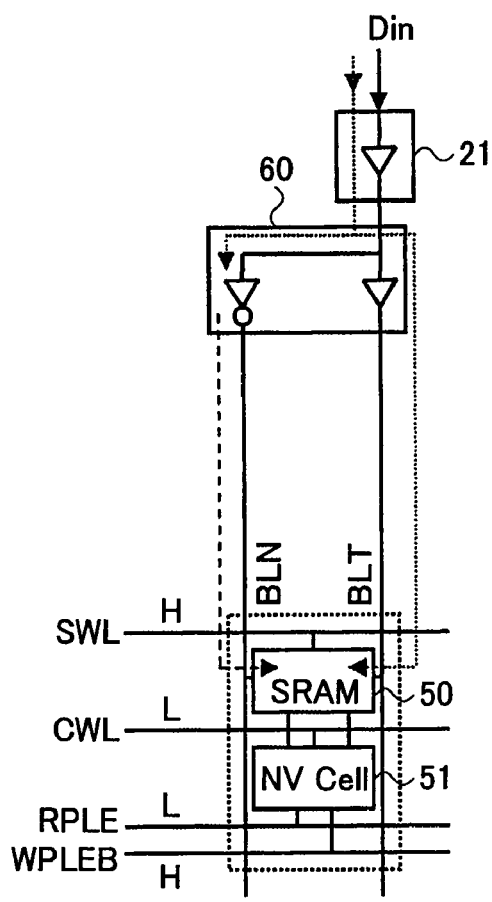
FIGS. 7A and 7B are illustrative drawings for explaining a second embodiment of the write and store operations of the memory cell shown in FIG. 3.
Figure 7B:
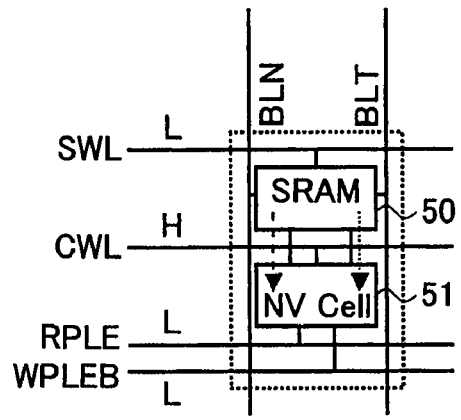

FIGS. 7A and 7B are illustrative drawings for explaining a second embodiment of the write and store operations of the memory cell shown in FIG. 3. In FIGS. 7A and 7B, the same elements as those of FIGS. 2, 3, and 4A through 4C are referred to by the same numerals, and a description thereof will be omitted.

FIG. 7A shows a write operation by which data supplied from the exterior of the semiconductor memory device 20 is stored in the SRAM cell 50. As shown in FIG. 7A, the SRAM word line SWL is set to HIGH, and the NV word line CWL is set to LOW. Further, the recall plate voltage enable line RPLE is set to LOW, and the store plate voltage enable line WPLEB is set to HIGH.

With these settings of the signal lines, data is supplied from the exterior to the write buffer 60 via the Din buffer 21. The two binary values output from the write buffer 60 to the bit lines BLN and BLT are stored in the SRAM cell 50, with the SRAM word line SWL being in the HIGH state to couple the bit lines BLN and BLT to the SRAM cell 50.

FIG. 7B shows a store operation by which the data stored in the SRAM cell 50 is transferred to the NV cell 51. As shown in FIG. 7B, the SRAM word line SWL is set to LOW, and the NV word line CWL is set to HIGH. Further, the recall plate voltage enable line RPLE is set to LOW, and the store plate voltage enable line WPLEB is set to LOW.

As the store plate voltage enable line WPLEB is set to LOW, the PMOS transistor 45 shown in FIG. 3 is turned on to set the plate line to a high potential VPP (e.g., 3.3 V). With the NV word line CWL being HIGH (e.g., 3.3 V), one of the NMOS transistors 31 and 32 of the NV cell 51 shown in FIG. 3 experiences a lingering change in its transistor characteristics in response to the data stored in the SRAM cell 50. The NV cell 51 thus stores the data of the SRAM cell 50 in a nonvolatile fashion.

Figure 8C:
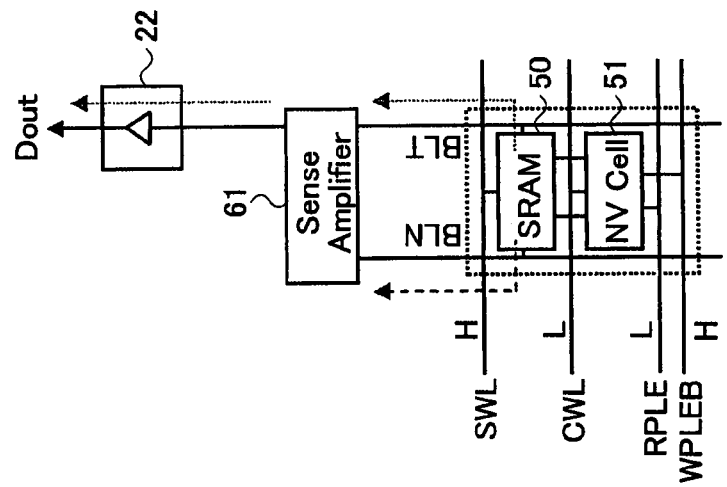
FIGS. 8A through 8C are illustrative drawings for explaining a second embodiment the recall and read operations of the memory cell shown in FIG. 3.
Figure 8B:
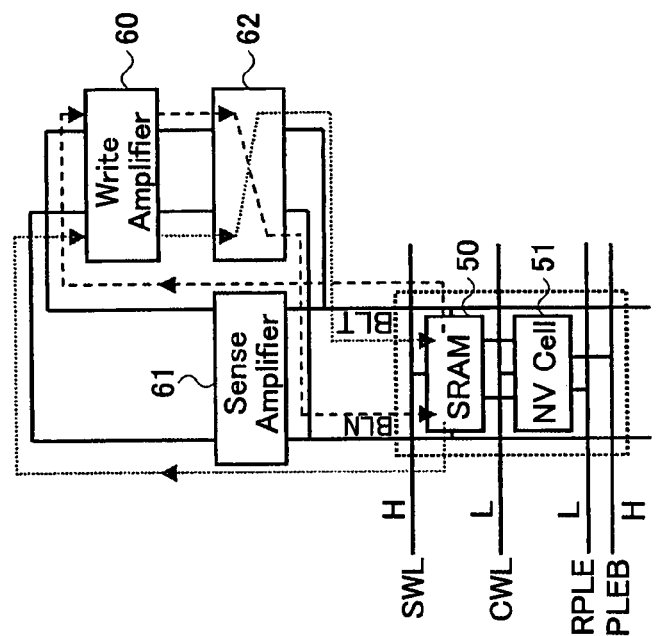
Figure 8A:
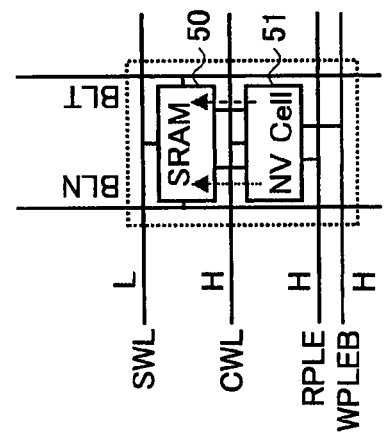

FIGS. 8A through 8C are illustrative drawings for explaining a second embodiment the recall and read operations of the memory cell shown in FIG. 3. In FIGS. 8A through 8C, the same elements as those of FIGS. 2, 3, and 4A through 4C are referred to by the same numerals, and a description thereof will be omitted.

FIG. 8A shows a recall operation by which data stored in the NV cell 51 is transferred to the SRAM cell 50. As shown in FIG. 5A, the SRAM word line SWL is set to LOW, and the NV word line CWL is set to HIGH. Further, the recall plate voltage enable line RPLE is set to HIGH, and the store plate voltage enable line WPLEB is set to HIGH.

As the recall plate voltage enable line RPLE is set to HIGH, the NMOS transistor 44 shown in FIG. 3 is turned on to set the plate line to the ground potential. With the NV word line CWL being HIGH (e.g., 1.8 V), one of the NMOS transistors 31 and 32 of the NV cell 51 shown in FIG. 3 pulls down a corresponding one of the nodes C and /C stronger than the other transistor pulls down the other one of the nodes C and /C. As a result, the SRAM cell 50 latches that data that is stored in the NV cell 51. It should be noted that the recalled data have the inverted bit values since the originally stored bit values are inverted by the recall operation.

FIG. 8B shows an operation by which the data stored in the SRAM cell 50 is inverted as post-processing after the recalling of data from the NV cell 51. As shown in FIG. 8B, the SRAM word line SWL is set to HIGH, and the NV word line CWL is set to LOW. Further, the recall plate voltage enable line RPLE is set to LOW, and the store plate voltage enable line WPLEB is set to HIGH.

With these settings of the signal lines, the data stored in the SRAM cell 50 are read to the bit lines BLN and BLT, and are amplified by the sense amplifier 61. The data amplified by the sense amplifier 61 are supplied to the write buffer 60. The write buffer 60 amplifies the data supplied from the sense amplifier 61, and supplies the amplified data to the inverting circuit 62. The inverting circuit 62 may simply swap the two supplied bits with each other to output the swapped bits, or may simply invert each of the two supplied bits. The inverted data output from the inverting circuit 62 are supplied to the SRAM cell 50 for storage therein.

Since this operation described above reverses the data stored in the SRAM cell 50 based on the data stored in the SRAM cell 50, the data may keep being reversed again and again unless the loop that includes the sense amplifier 61, the write buffer 60, and inverting circuit 62 is cut at proper timing. This may be done by making the sense amplifier 61 insensitive to its inputs (i.e., the bit lines BLN and BLT) while maintaining the signal level of its output data, for example.

It should be noted that the inverting circuit 62 may be situated between the write buffer 60 and the bit lines BLN and BLT even when the write operation as shown in FIG. 7A is performed (although the inverting circuit 62 is not illustrated in FIG. 7A for the convenience of explanation). During the write operation, the inverting function of inverting circuit 62 may be disabled under the control of the timing controller 26. Further, the signal paths that connect between the sense amplifier 61 and the write buffer 60 to establish the above-described loop may include switching function, so that these paths are established only during the post-processing operation as described above. During operations other than the post-processing operation, these paths may be closed so that there is no returning of the data read from the SRAM cell 50 to the SRAM cell 50. These operations are implemented under the control of the timing controller 26.

FIG. 8C shows a read operation by which the data stored in the SRAM cell 50 is read out to the exterior of the semiconductor memory device 20. As shown in FIG. 5B, the SRAM word line SWL is set to HIGH, and the NV word line CWL is set to LOW. Further, the recall plate voltage enable line RPLE is set to LOW, and the store plate voltage enable line WPLEB is set to HIGH.

With the SRAM word line SWL being in the HIGH state to couple the bit lines BLN and BLT to the SRAM cell 50, data stored in the SRAM cell 50 are read to the bit lines BLN and BLT. The sense amplifier 61 amplifies the data supplied via the bit lines BLN and BLT. The data amplified by the sense amplifier 61 is then output to the exterior of the semiconductor memory device 20 via the Dout buffer 22.

Figure 9:
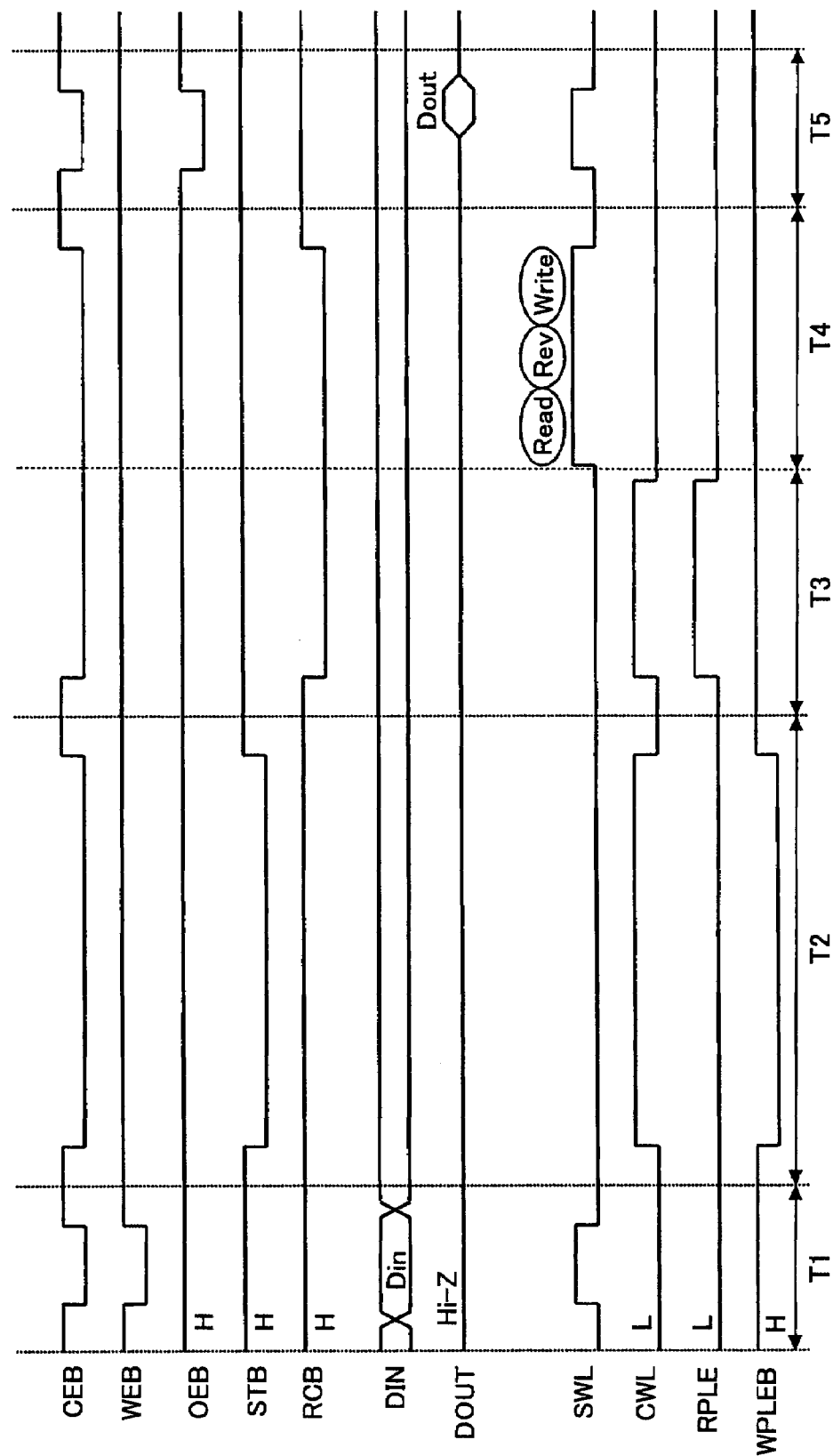
FIG. 9 is a drawing showing signal waveforms for explaining the second embodiment of the write, store, recall, and read operations of the memory cell shown in FIG. 3.

FIG. 9 is a drawing showing signal waveforms for explaining the second embodiment of the write, store, recall, and read operations of the memory cell shown in FIG. 3.

T1 is a time period in which the write operation as shown in FIG. 7A is performed. During this period T1, the write enable signal WEB is asserted (set to LOW). In response, the SRAM word line SWL is set to HIGH to allow input data Din to be stored in the SRAM cell 50.

T2 is a time period in which the store operation as shown in FIG. 7B is performed. In response to the assertion (LOW state) of the store enable signal STB, the NV word line CWL is set to HIGH, and the store plate voltage enable line WPLEB is asserted (set to LOW). As a result, the data stored in the SRAM cell 50 is stored in the NV cell 51 in a nonvolatile manner.

T3 is a time period in which the recall operation as shown in FIG. 8A is performed. In response to the assertion (LOW state) of the recall enable signal RCB, the NV word line CWL is set to HIGH, and the recall plate voltage enable line RPLE is asserted (set to HIGH). This results in the data stored in the NV cell 51 being transferred to the SRAM cell 50.

T4 is a time period in which the post-processing (i.e., the inverting of the stored data) after recall operation as shown in FIG. 8B is performed. In response to the assertion (LOW state) of the recall enable signal RCB, the timing controller 26 generates various timing control signals that control the X driver 28, the write-amplifier-&-sense-amplifier unit 24, and the Y switch 25 so as to cause the data to be read from the SRAM cell 50, inverted, and stored again in the SRAM cell 50 after performing the recall operation transferring the data from the NV cell 51 to the SRAM cell 50.

T5 is a time period in which the read operation as shown in FIG. 8C is performed. In response to the assertion (LOW state) of the output enable signal OEB, the SRAM word line SWL is set to HIGH so as to electrically couple the SRAM cell 50 to the bit lines BLN and BLT. As a result, the data stored in the SRAM cell 50 is output to the exterior of the semiconductor memory device as output data Dout.

Figure 10:
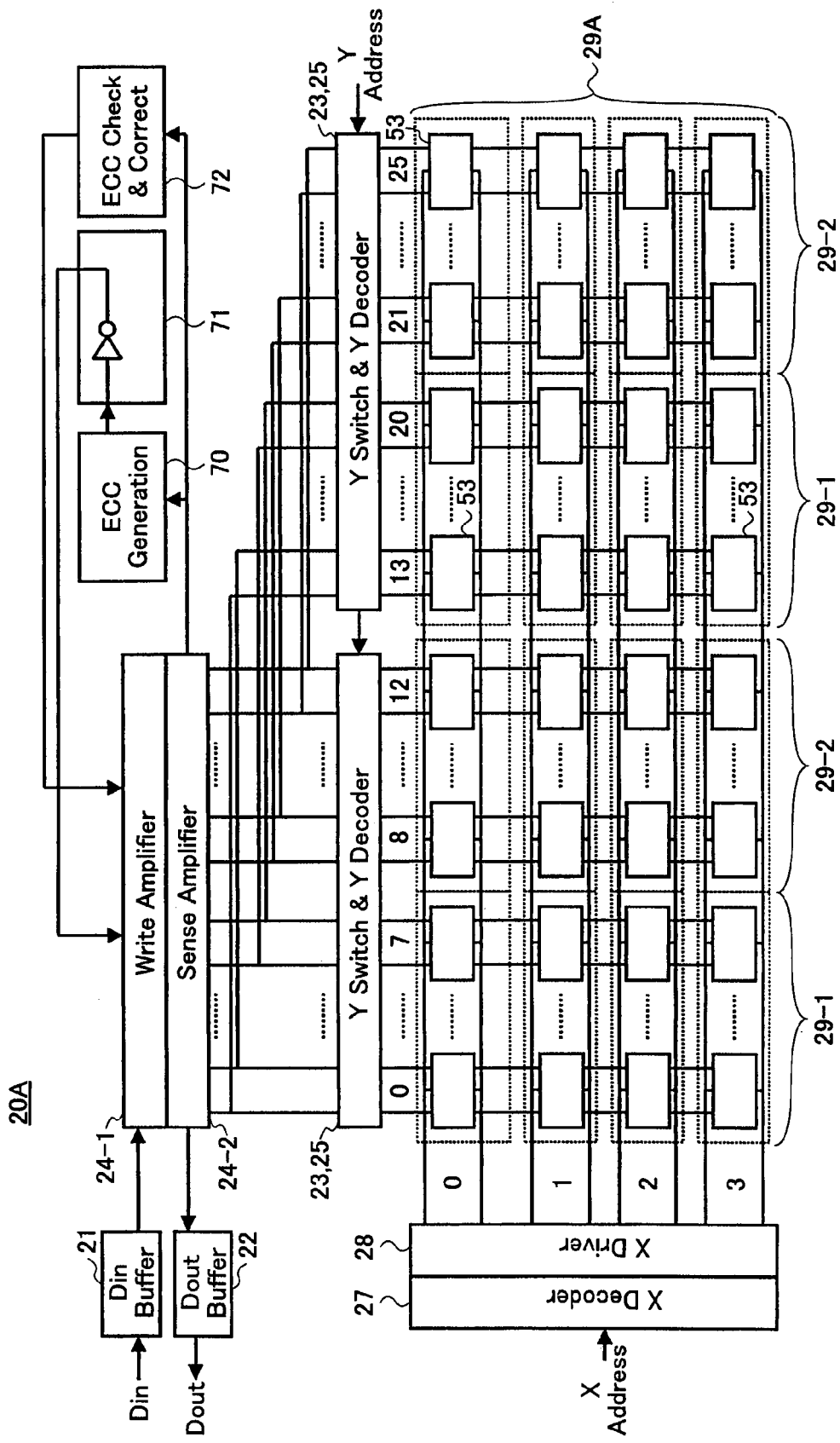
FIG. 10 is a block diagram showing the configuration of a second embodiment of a nonvolatile semiconductor memory device according to the present invention.

FIG. 10 is a block diagram showing the configuration of a second embodiment of a nonvolatile semiconductor memory device according to the present invention. In FIG. 10, the same elements as those of FIG. 2 are referred to by the same numerals, and a description thereof will be omitted.

A semiconductor memory device 20A shown in FIG. 10 differs from the semiconductor memory device 20 shown in FIG. 2 in that the semiconductor memory device 20A is provided with an error correction function. Namely, a memory cell array 29A includes data-bit portions 29-1 and ECC-redundant-bit portions 29-2. The data-bit portions 29-1 serve to store data bits, and the ECC-redundant-bit portions 29-2 serve to store redundant bits for error check and correction. Memory cells 53 are arranged in matrix form in the memory cell array 29A. Here, only some of the memory cells 53 are designated with the reference number for the sake of clarity of illustration. Each of the memory cells 53 has the configuration that is shown in FIG. 3.

Further, an ECC generation unit 70 is provided for the purpose of generating redundant bits based on data bits to be stored. An ECC check-&-correct unit 72 is provided for the purpose of performing a check and correction by use of error correcting codes (ECC) with respect to data bits and redundant bits read from the memory cell array 29A. An inverting circuit 71 serves to invert data in order to correct the data reversal that occurs because the HIGH/LOW levels of the nodes C and /C (see FIG. 3) are reversed between when the data is stored and when the data is recalled. That is, the inverting circuit 71 is equivalent to the inverting circuit 62 used in the first embodiment of the semiconductor memory device.

The timing controller 26 is not shown in FIG. 10 for the sake of convenience of illustration, but is provided in the semiconductor memory device 20A in the same manner as in the semiconductor memory device 20, except for some minor differences relating to the ECC-based check-&-correction operation. That is, the timing controller of the semiconductor memory device 20A is configured to control the ECC generation unit 70, the inverting circuit 71, and the ECC check-&-correct unit 72 to perform various operations as will later be described.

Further, in FIG. 10, the Y decoder 23 and Y switch 25 are shown as one integrated unit "Y Switch & Y Decoder" for the sake of convenience of illustration. The operations and configurations of the Y decoder 23 and Y switch 25 are the same between the semiconductor memory device 20 and the semiconductor memory device 20A. Moreover, in FIG. 10, the write-amplifier-&-sense-amplifier unit 24 is shown as two separate units, i.e., a write amplifier unit 24-1 and a sense amplifier unit 24-2, the operations and configurations of which are the same between the semiconductor memory device 20 and the semiconductor memory device 20A.

The ECC generation unit 70 calculates redundant bits for the error correction purpose based on data bits to be written, and stores in the memory cell array 29A the calculated redundant bits together with the data bits to be written. At the time of data reading, retrieved data and redundant bits are checked to see if the data and redundant bits contain an error. If error is detected, error correction is performed. If the Hamming code is used for error correction, for example, error correction is possible if one-bit error occurs in the code, while only error detection is possible if two-bit error occurs. When the Hamming code is used, 5 bits are needed as redundant bits for data of 8-bit width, 6 bits needed as redundant bits for data of 16-bit width, 7 bits needed as redundant bits for data of 32-bit width, and 8 bits needed as redundant bits for data of 64-bit width.

Figure 11:
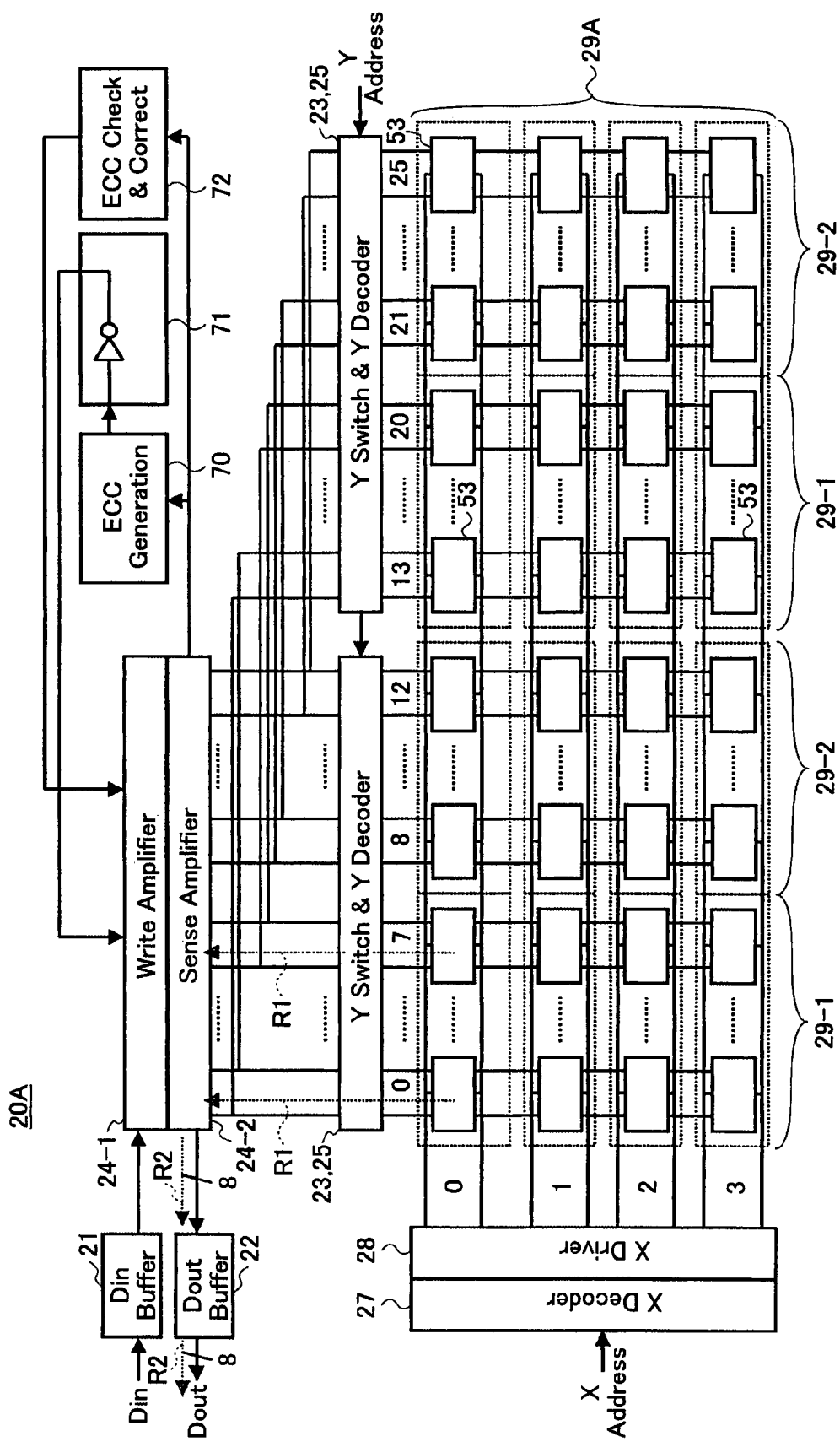
FIG. 11 is an illustrative drawing for explaining a read operation of the semiconductor memory device shown in FIG. 10.

FIG. 11 is an illustrative drawing for explaining a read operation of the semiconductor memory device 20A. In FIG. 11, the same elements as those of FIG. 10 are referred to by the same numerals, and a description thereof will be omitted.

In a read operation, data bits are retrieved from a data-bit portion 29-1 of the memory cell array 29A as indicated by dotted arrows R1. These retrieved data bits are then amplified by the sense amplifier unit 24-2, followed by being output through the Dout buffer 22 as indicated by dotted arrows R2. It should be noted that the data read operation is performed with respect to the SRAM cells 50 of the memory cells 53.

Figure 12:
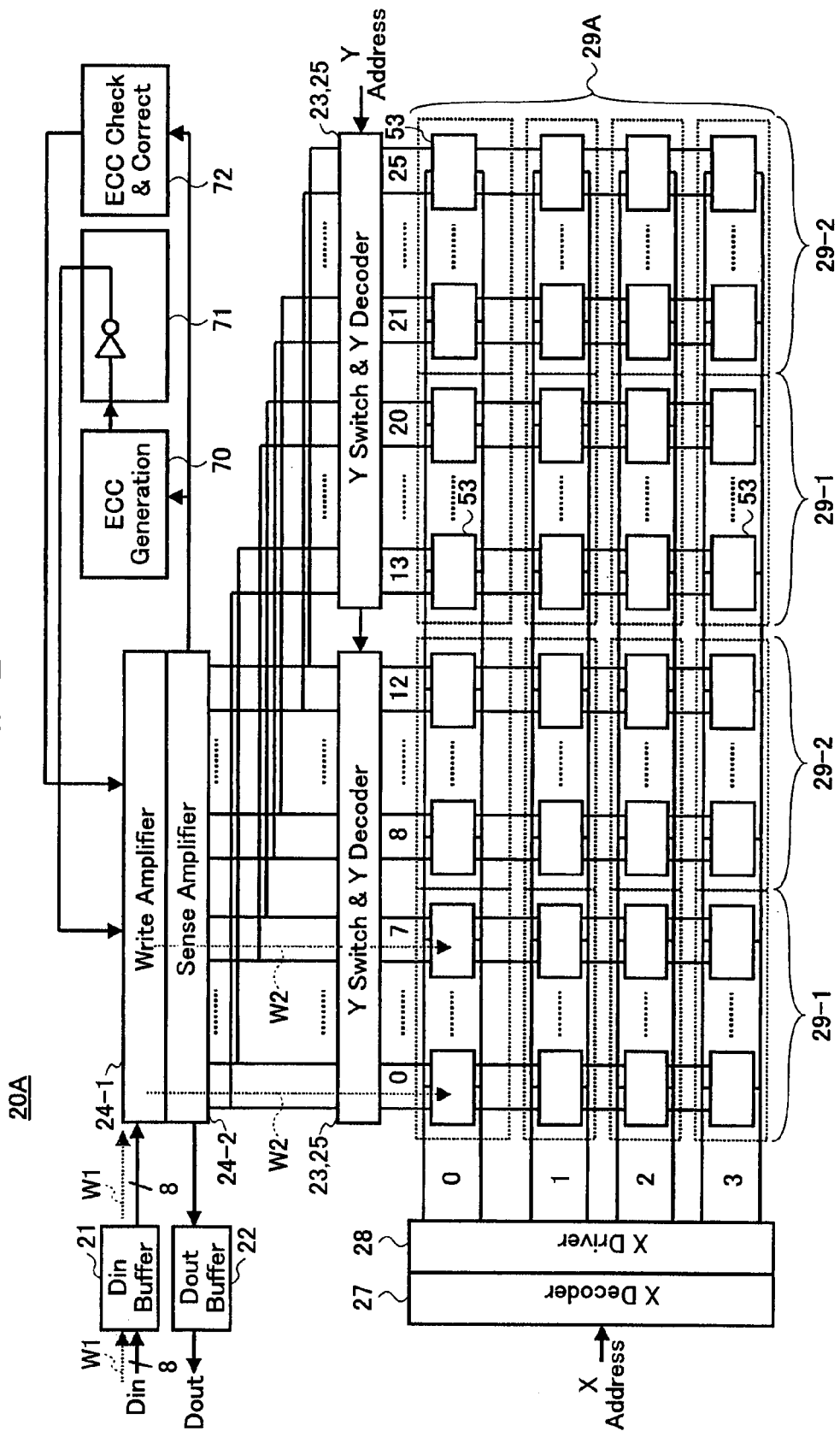
FIG. 12 is an illustrative drawing for explaining a write operation of the semiconductor memory device shown in FIG. 10.

FIG. 12 is an illustrative drawing for explaining a write operation of the semiconductor memory device 20A. In FIG. 12, the same elements as those of FIG. 10 are referred to by the same numerals, and a description thereof will be omitted.

In a write operation, data bits are supplied from the exterior of the device to the write amplifier unit 24-1 through the Din buffer 21 as indicated by dotted arrows W1. These data bits are then amplified by the write amplifier unit 24-1, followed by being written to a data-bit portion 29-1 as indicated by dotted arrows W2. It should be noted that the write operation is performed with respect to the SRAM cells 50 of the memory cells 53.

As described above, the error correction function of the semiconductor memory device 20A is not used during the write operation and the read operation. Since the SRAM cells 50 of the memory cells 53 are sufficiently reliable as to their data recording and retention capability, no error may occur during the write and read operations. Further, without using the error correction function, the write and read operations can be performed at high speed.

Figure 13:
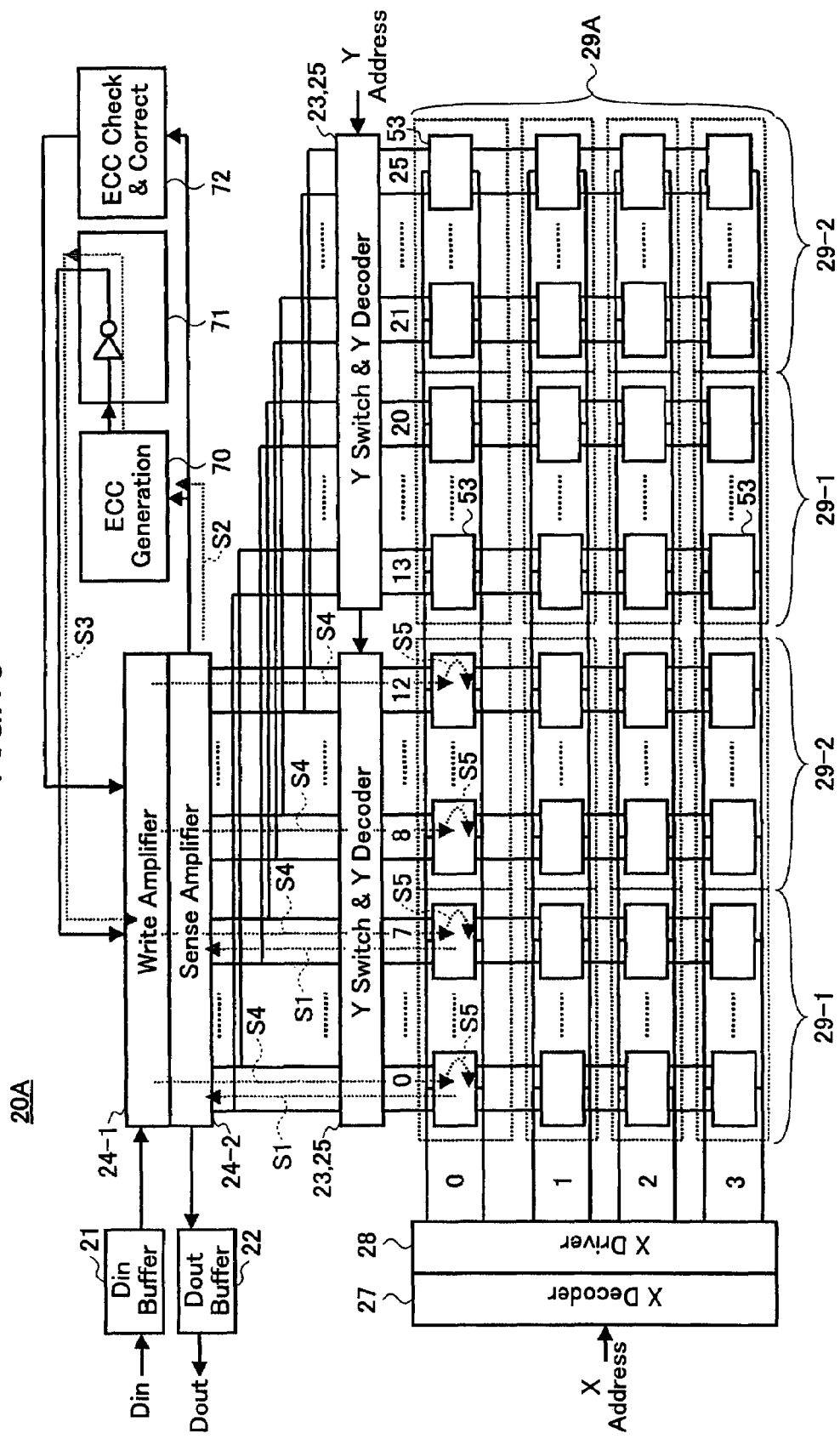
FIG. 13 is an illustrative drawing for explaining a store operation of the semiconductor memory device shown in FIG. 10.

FIG. 13 is an illustrative drawing for explaining a store operation of the semiconductor memory device 20A. In FIG. 13, the same elements as those of FIG. 10 are referred to by the same numerals, and a description thereof will be omitted.

Data bits stored in the SRAM cells 50a of a data-bit portion 29-1 are read and supplied to the sense amplifier unit 24-2 as indicated by dotted arrows S1. The sense amplifier unit 24-2 amplifies the retrieved data bits, and supplies the amplified data bits to the ECC generation unit 70 as indicated by a dotted arrow S2. The ECC generation unit 70 generates redundant bits based on the supplied data bits, and supplies the data bits and redundant bits to the inverting circuit 71. The inverting circuit 71 inverts the data bits and redundant bits for provision to the write amplifier unit 24-1 as indicated by dotted arrow S3. The write amplifier unit 24-1 amplifies the inverted data bits and inverted redundant bits for provision to the SRAM cells 50 of the data-bit portion 29-1 and associated ECC-redundant-bit portion 29-2 as indicated by dotted arrows S4. After the preparation operation as described above, the data bits and redundant bits stored in the SRAM cells 50 are stored in the NV cells 51 in a nonvolatile manner as indicated by dotted arrows S5.

In this manner, redundant bits for the error correction purpose are stored together with data bits. In so doing, the data bits and redundant bits are inverted as preparation for the store operation. It should be appreciated that the data inversion by the inverting circuit 71 needs to be applied to both the data bits and the redundant bits after the generation of the redundant bits, rather than inverting the data bits before the generation of redundant bits.

Figure 14:
FIG. 14 is a drawing showing signal waveforms for explaining the preparation and store operations of the semiconductor memory device shown in FIG. 10.

FIG. 14 is a drawing showing signal waveforms for explaining the preparation and store operations of the semiconductor memory device 20A shown in FIG. 10.

T1 is a time period in which the preparation for store operation is performed. At the beginning of this period T1, the store enable signal STB is asserted (set to LOW). In response, the timing controller 26 generates various timing control signals that control the X driver 28, the write-amplifier-&-sense-amplifier unit 24, and the Y switch 25 so as to perform the reading of data bits from the SRAM cells 50, the generating of redundant bits based on the data bits, the inverting (reversing) of the data bits and redundant bits, and the storing of the inverted data bits and inverted redundant bits in the SRAM cells 50. It should be noted that during the period T1, the SRAM word line SWL is set to HIGH to couple the SRAM cells 50 to the corresponding bit lines BLN and BLT.

T2 is a time period in which the store operation is performed. Under the control of the timing controller 26 that has started the sequence of operations in response to the assertion of the store enable signal STB, the NV word line CWL is set to HIGH, and the store plate voltage enable line WPLEB is asserted (set to LOW) As a result, the data bits and redundant bits stored in the SRAM cells 50 are stored in the NV cells 51 in a nonvolatile manner.

Figure 15:
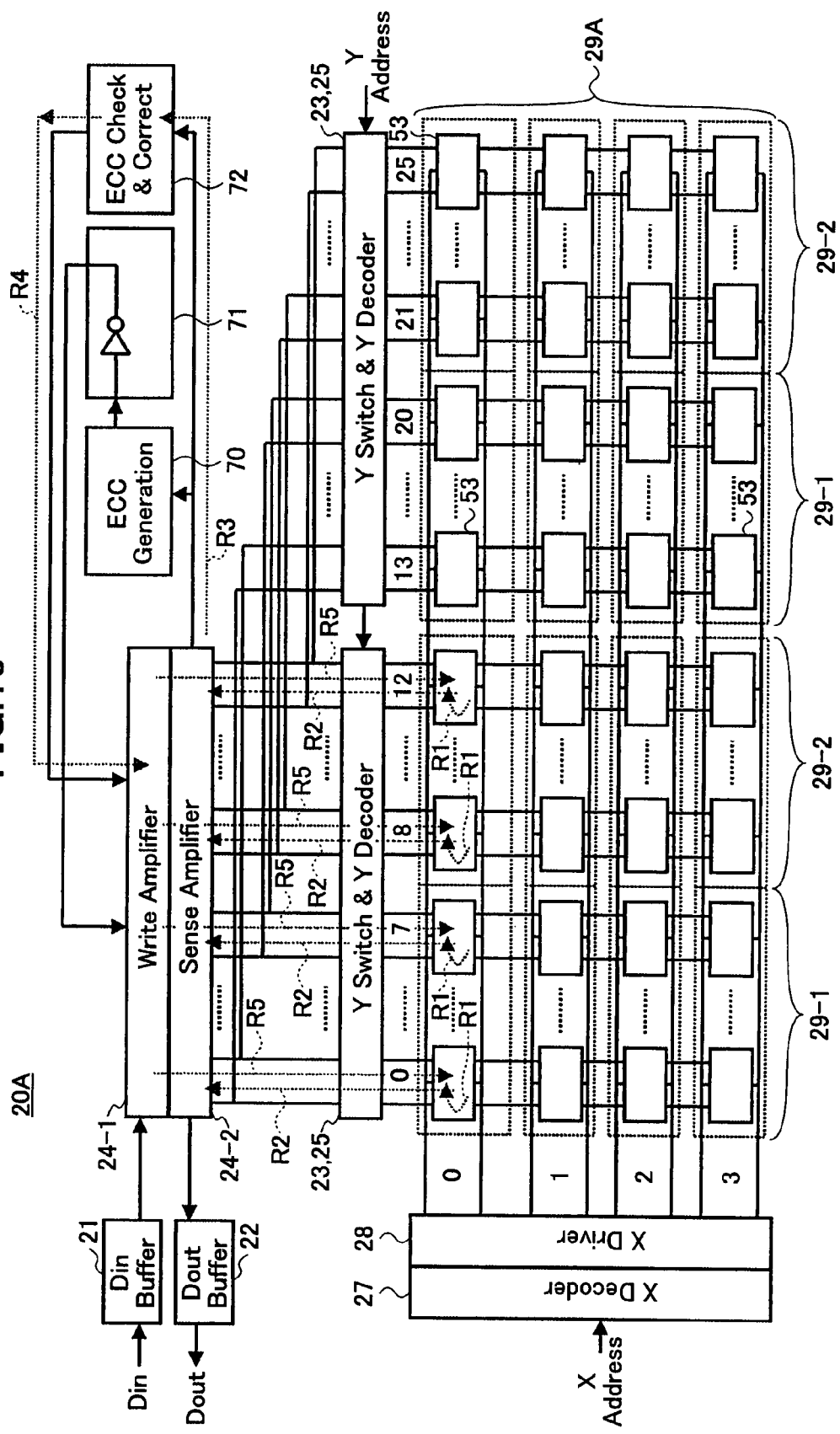
FIG. 15 is an illustrative drawing for explaining a recall operation of the semiconductor memory device shown in FIG. 10.

FIG. 15 is an illustrative drawing for explaining a recall operation of the semiconductor memory device 20A. In FIG. 15, the same elements as those of FIG. 10 are referred to by the same numerals, and a description thereof will be omitted.

Data bits and redundant bits stored in the NV cells 51 of the data-bit portions 29-1 and ECC-redundant-bit portions 29-2 are recalled so that these bits are transferred to the corresponding SRAM cells 50 as indicated by dotted arrows R1. It should be noted that the recalled data bits and redundant bits have correct bit values since the original bit values inverted by the inverting circuit 71 prior to the store operation are inverted back to the original values by the recall operation.

After this, the data bits and redundant bits stored in the SRAM cells 50a are read and supplied to the sense amplifier unit 24-2 as indicated by dotted arrows R2. The sense amplifier unit 24-2 amplifies the retrieved data bits and redundant bits, and supplies the amplified data bits and redundant bits to the ECC check-&-correct unit 72 as indicated by a dotted arrow R3. The ECC check-&-correct unit 72 performs an error check and correction based on the supplied data bits and redundant bits, and supplies to the write amplifier unit 24-1 (as indicated by an arrow R4) the data bits and redundant bits as corrected according to need. The write amplifier unit 24-1 amplifies the data bits and redundant bits for provision to the SRAM cells 50 of the data-bit portion 29-1 and ECC-redundant-bit portion 29-2 as indicated by dotted arrows R5.

Figure 16:
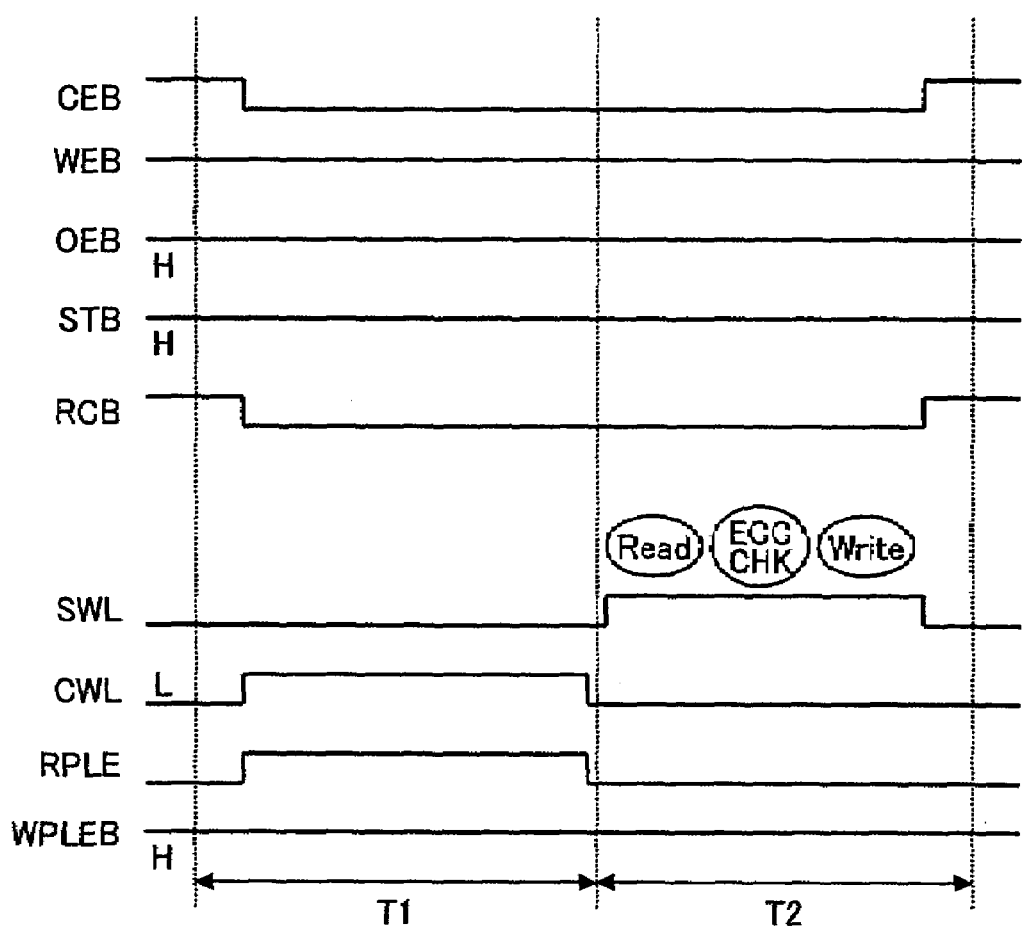
FIG. 16 is a drawing showing signal waveforms for explaining the recall and check-&-correction operations of the semiconductor memory device shown in FIG. 10.

FIG. 16 is a drawing showing signal waveforms for explaining the recall and check-&-correction operations of the semiconductor memory device 20A shown in FIG. 10.

T1 is a time period in which the recall operation is performed. In response to the assertion (LOW state) of the recall enable signal RCB, the NV word line CWL is set to HIGH, and the recall plate voltage enable line RPLE is asserted (set to HIGH). This results in the data bits and redundant bits stored in the NV cells 51 being transferred to the SRAM cells 50.

T2 is a time period in which the check-&-correction operation is performed. In response to the assertion (LOW state) of the recall enable signal RCB that has initiated the sequence of operations, the SRAM word line SWL is set to HIGH so as to electrically couple the SRAM cells 50 to the bit lines. The data bits and redundant bits retrieved on the bit lines are amplified, subjected to the ECC check-&-correction, and written back to the SRAM cells 50.

Figure 17:
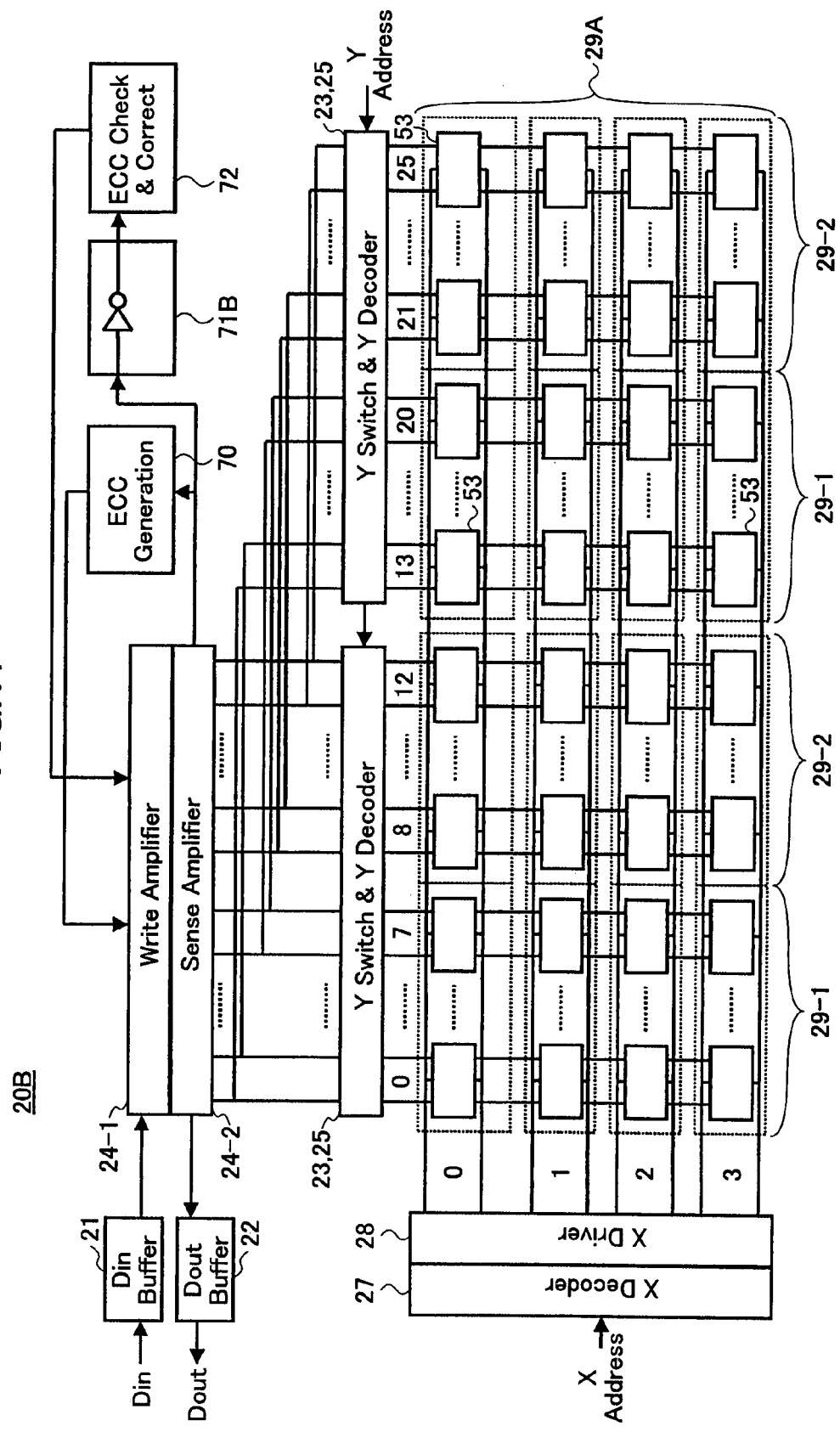
FIG. 17 is a block diagram showing the configuration of a third embodiment of the nonvolatile semiconductor memory device according to the present invention.

FIG. 17 is a block diagram showing the configuration of a third embodiment of a nonvolatile semiconductor memory device according to the present invention. In FIG. 17, the same elements as those of FIG. 10 are referred to by the same numerals, and a description thereof will be omitted.

A semiconductor memory device 20B shown in FIG. 17 differs from the semiconductor memory device 20A shown in FIG. 10 in that the input into an inverting circuit (71B) shown in FIG. 17 is supplied directly from the sense amplifier unit 24-2, and that the output from the inverting circuit is supplied to the ECC check-&-correct unit 72. Such provision is made in this embodiment in order to perform the inversion of data bits and redundant bits as post-processing after a recall operation.

Figure 18:
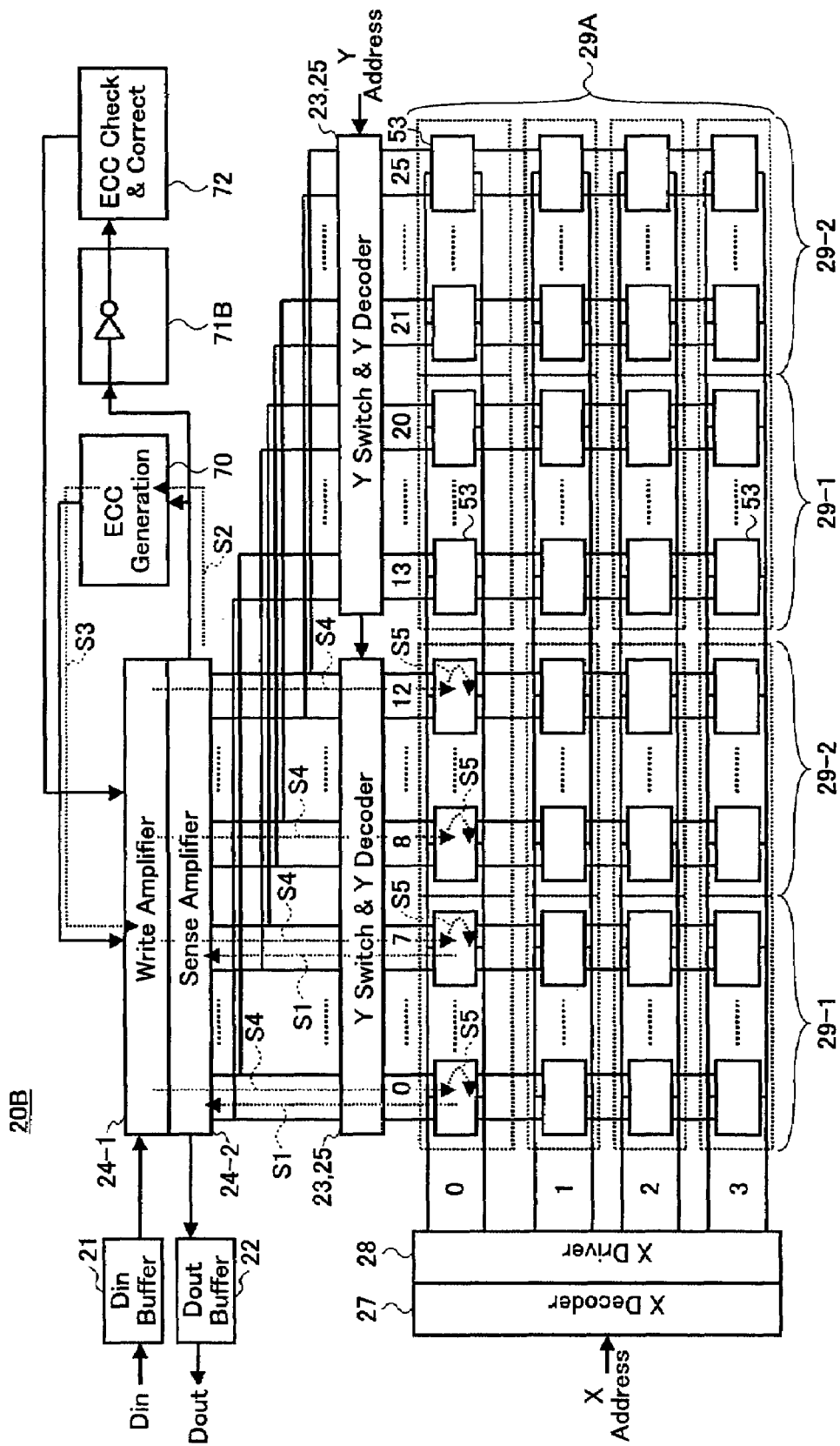
FIG. 18 is an illustrative drawing for explaining a store operation of the semiconductor memory device shown in FIG. 17.

FIG. 18 is an illustrative drawing for explaining a store operation of the semiconductor memory device 20B. In FIG. 18, the same elements as those of FIG. 17 are referred to by the same numerals, and a description thereof will be omitted.

Data bits stored in the SRAM cells 50a of a data-bit portion 29-1 are read and supplied to the sense amplifier unit 24-2 as indicated by dotted arrows S1. The sense amplifier unit 24-2 amplifies the retrieved data bits, and supplies the amplified data bits to the ECC generation unit 70 as indicated by a dotted arrow S2. The ECC generation unit 70 generates redundant bits based on the supplied data bits, and supplies the data bits and redundant bits to the write amplifier unit 24-1 as indicated by dotted arrow S3. The write amplifier unit 24-1 amplifies the data bits and redundant bits for provision to the SRAM cells 50 of the data-bit portion 29-1 and associated ECC-redundant-bit portion 29-2 as indicated by dotted arrows S4. After the ECC-generation operation as described above, the data bits and redundant bits stored in the SRAM cells 50 are stored in the NV cells 51 in a nonvolatile manner as indicated by dotted arrows S5.

Figure 19:
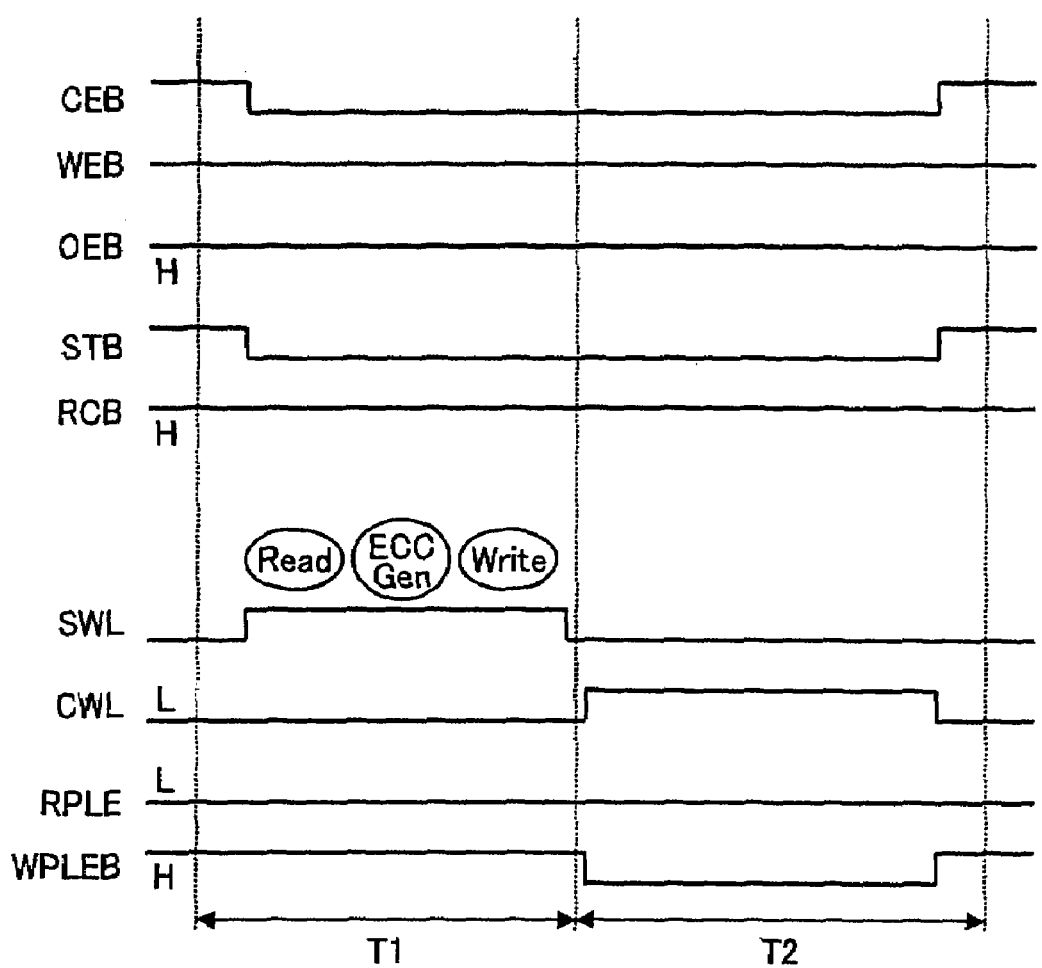
FIG. 19 is a drawing showing signal waveforms for explaining the ECC-generation and store operations of the semiconductor memory device shown in FIG. 17.

FIG. 19 is a drawing showing signal waveforms for explaining the ECC-generation and store operations of the semiconductor memory device 20B shown in FIG. 17.

T1 is a time period in which the ECC-generation operation is performed. At the beginning of this period T1, the store enable signal STB is asserted (set to LOW). In response, the timing controller 26 generates various timing control signals that control the X driver 28, the write-amplifier-&-sense-amplifier unit 24, and the Y switch 25 so as to perform the reading of data bits from the SRAM cells 50, the generating of redundant bits based on the data bits, and the storing of the data bits and redundant bits in the SRAM cells 50. It should be noted that during the period T1, the SRAM word line SWL is set to HIGH to couple the SRAM cells 50 to the corresponding bit lines.

T2 is a time period in which the store operation is performed. Under the control of the timing controller 26 that has started the sequence of operations in response to the assertion of the store enable signal STB, the NV word line CWL is set to HIGH, and the store plate voltage enable line WPLEB is asserted (set to LOW). As a result, the data bits and redundant bits stored in the SRAM cells 50 are stored in the NV cells 51 in a nonvolatile manner.

Figure 20:
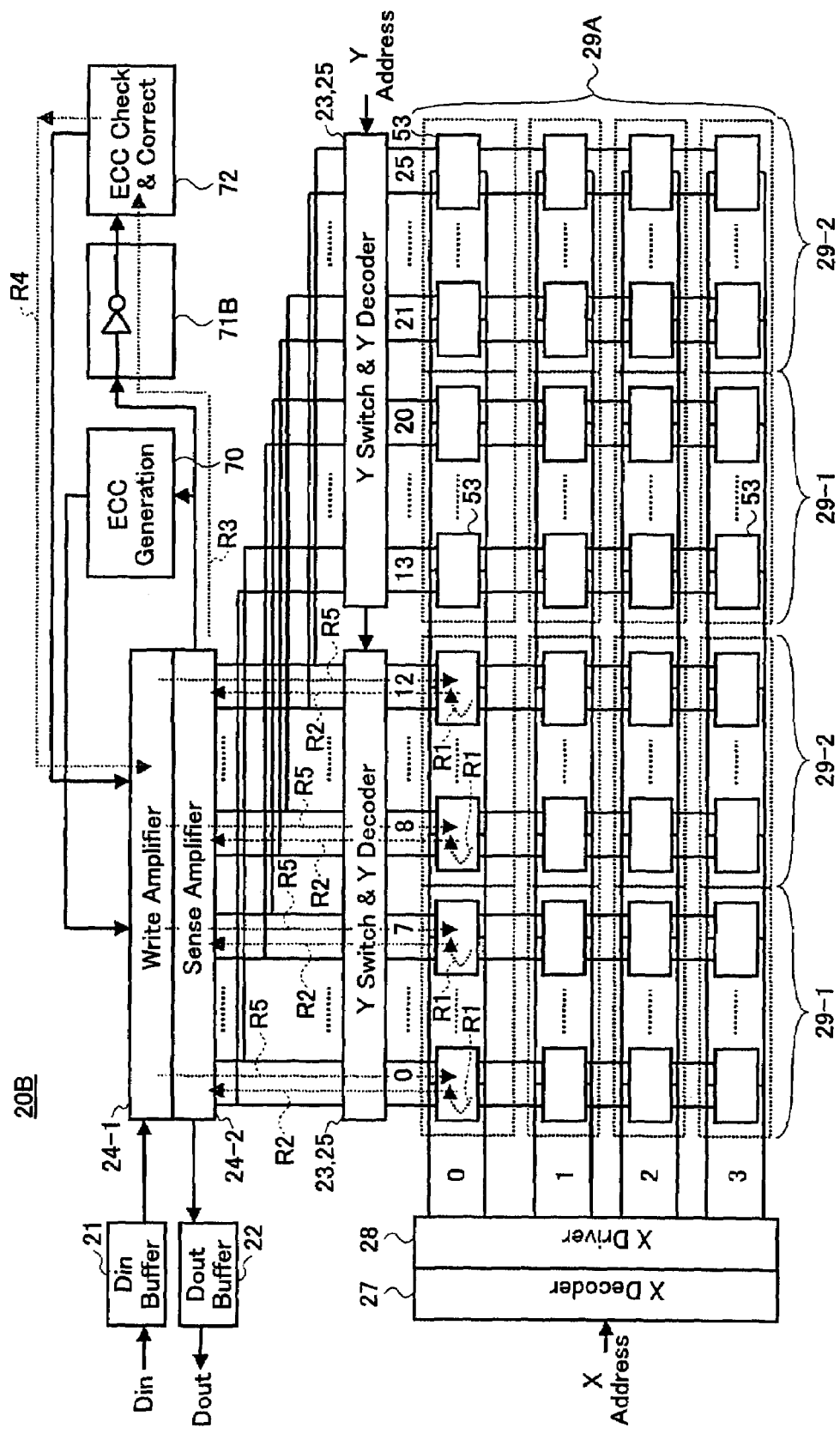
FIG. 20 is an illustrative drawing for explaining a recall operation of the semiconductor memory device shown in FIG. 17.

FIG. 20 is an illustrative drawing for explaining a recall operation of the semiconductor memory device 20B. In FIG. 20, the same elements as those of FIG. 17 are referred to by the same numerals, and a description thereof will be omitted.

Data bits and redundant bits stored in the NV cells 51 of the data-bit portions 29-1 and ECC-redundant-bit portions 29-2 are recalled so that these bits are transferred to the corresponding SRAM cells 50 as indicated by dotted arrows R1. It should be noted that the recalled data bits and redundant bits have inverted bit values since the originally stored bit values are inverted by the recall operation.

After this, the data bits and redundant bits stored in the SRAM cells 50a are read and supplied to the sense amplifier unit 24-2 as indicated by dotted arrows R2. The sense amplifier unit 24-2 amplifies the retrieved data bits and redundant bits, and supplies the amplified data bits and redundant bits to the inverting circuit 71B as indicated by a dotted arrow R3. The inverting circuit 71B inverts the supplied data bits and redundant bits so as to correct the bit values that have been inverted by the recall operation. The inverting circuit 71B supplies the inverted correct data bits and redundant bits to the ECC check-&-correct unit 72. The ECC check-&-correct unit 72 performs an error check and correction based on the supplied data bits and redundant bits, and supplies to the write amplifier unit 24-1 (as indicated by an arrow R4) the data bits and redundant bits as corrected according to need. The write amplifier unit 24-1 amplifies the data bits and redundant bits for provision to the SRAM cells 50 of the data-bit portion 29-1 and ECC-redundant-bit portion 29-2 as indicated by dotted arrows R5.

Figure 21:
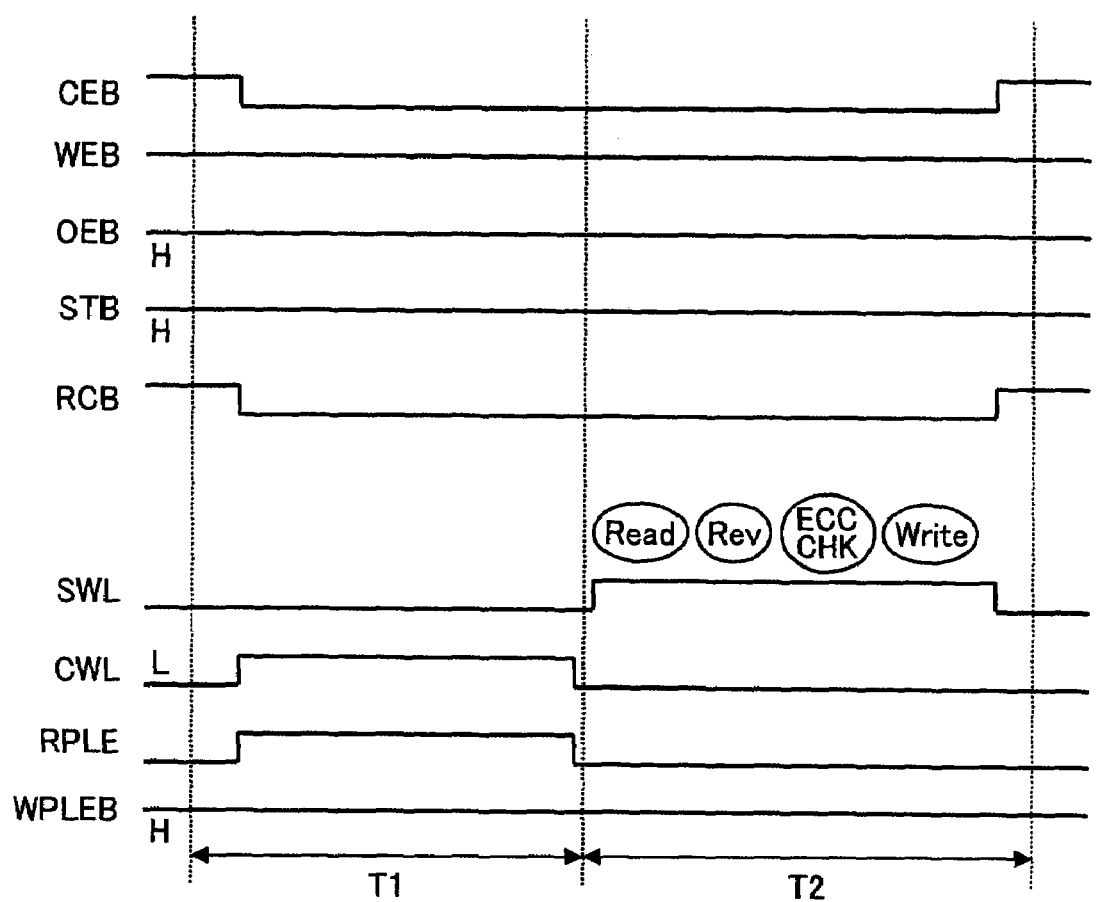
FIG. 21 is a drawing showing signal waveforms for explaining the recall and check-&-correction operations of the semiconductor memory device shown in FIG. 17.

FIG. 21 is a drawing showing signal waveforms for explaining the recall and check-&-correction operations of the semiconductor memory device 20B shown in FIG. 17.

T1 is a time period in which the recall operation is performed. In response to the assertion (LOW state) of the recall enable signal RCB, the NV word line CWL is set to HIGH, and the recall plate voltage enable line RPLE is asserted (set to HIGH). This results in the data bits and redundant bits stored in the NV cells 51 being transferred to the SRAM cells 50.

T2 is a time period in which the check-&-correction operation is performed. In response to the assertion (LOW state) of the recall enable signal RCB that has initiated the sequence of operations, the SRAM word line SWL is set to HIGH so as to electrically couple the SRAM cells 50 to the bit lines. The data bits and redundant bits retrieved on the bit lines are amplified, inverted, subjected to the ECC check-&-correction, and written back to the SRAM cells 50. It should be appreciated that the inverting of the data bits and redundant bits needs to be performed prior to the ECC check-&-correction, rather than inverting the data bits and redundant bits after the ECC check-&-correction.

Further, the present invention is not limited to these embodiments, but various variations and modifications may be made without departing from the scope of the present invention.

What is claimed is:

1. A nonvolatile semiconductor memory device, comprising:
   a control circuit;
   an inverting circuit; and
   a plurality of memory units arranged in a matrix, each of the memory units including:
   a latch having a first node and a second node configured to be set to potentials responsive to latched data and inverse to each other;
   a plate line configured to be settable to a selected one of a first potential and a second potential;
   a first MIS transistor having one of source/drain nodes thereof coupled to the first node of the latch, another one of the source/drain nodes thereof coupled to the plate line, and a gate node thereof coupled to a word line; and
   a second MIS transistor having one of source/drain nodes thereof coupled to the second node of the latch, another one of the source/drain nodes thereof coupled to the plate line, and a gate node thereof coupled to the word line,
   wherein the control circuit is configured to perform an inverting operation that inverts the data latched in the latch by reading the data from the latch, causing the inverting circuit to invert the read data, and writing the inverted data to the latch.

2. The nonvolatile semiconductor memory device as claimed in claim 1, wherein the control circuit is configured to set the plate line to the first potential causing the first node to serve as a source node of the first MIS transistor in a first operation mode and to the second potential causing the first node to serve as a drain node of the first MIS transistor in a second operation mode, the first operation mode causing a lingering change in characteristics of the first MIS transistor, and the second operation mode causing the latch to store data responsive to the lingering change in the characteristics of the first MIS transistor.

3. The nonvolatile semiconductor memory device as claimed in claim 2, wherein the control circuit is configured to perform the inverting operation as preparation before the first operation mode.

4. The nonvolatile semiconductor memory device as claimed in claim 2, wherein the control circuit is configured to perform the inverting operation as post-processing after the second operation mode.

5. The nonvolatile semiconductor memory device as claimed in claim 1, further comprising an ECC generation unit configured to generate ECC redundant bits based on data bits, wherein the control circuit is configured to read data from latches of the memory units, to cause the ECC generation unit to generate the ECC redundant bits based on the read data, to cause the inverting circuit to invert the read data and the generated ECC redundant bits, and to write the inverted data and the inverted ECC redundant bits to the latches.

6. The nonvolatile semiconductor memory device as claimed in claim 2, further comprising an ECC generation unit configured to generate ECC redundant bits based on data bits, wherein the control circuit is configured to read data from latches of the memory units, to cause the ECC generation unit to generate the ECC redundant bits based on the read data, to cause the inverting circuit to invert the read data and the generated ECC redundant bits, and to write the inverted data and the inverted ECC redundant bits to the latches, as preparation before the first operation mode.

7. The nonvolatile semiconductor memory device as claimed in claim 6, further comprising an ECC check-&-correct unit configured to perform a check and correction with respect to data bits and ECC redundant bits, wherein the control circuit is configured to cause the ECC check-&-correct unit to perform a check and correction with respect to the data and ECC redundant bits read from the latches after the second operation mode.

8. The nonvolatile semiconductor memory device as claimed in claim 2, further comprising an ECC generation unit configured to generate ECC redundant bits based on data bits, wherein the control circuit is configured to read data from latches of the memory units, to cause the ECC generation unit to generate the ECC redundant bits based on the read data, and to write the read data and the generated ECC redundant bits to the latches.

9. The nonvolatile semiconductor memory device as claimed in claim 8, further comprising an ECC check-&-correct unit configured to perform a check and correction with respect to data bits and ECC redundant bits, wherein the control circuit is configured to read the data and ECC redundant bits from the latches after the second operation mode, to cause the inverting circuit to invert the read data and the read ECC redundant bits, and to cause the ECC check-&-correct unit to perform a check and correction with respect to the inverted data and the inverted ECC redundant bits.

* * * * *